US012738713B2

(12) United States Patent
Hayashi et al.

(10) Patent No.: US 12,738,713 B2
(45) Date of Patent: Sep. 15, 2026

(54) LASER DEVICE, LASER DEVICE ARRAY, AND METHOD OF PRODUCING A LASER DEVICE

(71) Applicant: SONY GROUP CORPORATION, Tokyo (JP)

(72) Inventors: Kentaro Hayashi, Tokyo (JP); Tatsushi Hamaguchi, Tokyo (JP); Susumu Sato, Kumamoto (JP); Rintaro Koda, Tokyo (JP)

(73) Assignee: Sony Group Corporation, Tokyo (JP)

(*) Notice: Subject to any disclaimer, the term of this patent is extended or adjusted under 35 U.S.C. 154(b) by 556 days.

(21) Appl. No.: 18/276,717

(22) PCT Filed: Jan. 11, 2022

(86) PCT No.: PCT/JP2022/000513

§ 371 (c)(1),
(2) Date: Aug. 10, 2023

(87) PCT Pub. No.: WO2022/176434

PCT Pub. Date: Aug. 25, 2022

(65) Prior Publication Data

US 2024/0120711 A1 Apr. 11, 2024

(30) Foreign Application Priority Data

Feb. 22, 2021 (JP) ................................ 2021-026424

(51) Int. Cl.
*H01S 5/183* (2006.01)
*H01S 5/026* (2006.01)
(Continued)

(52) U.S. Cl.
CPC ................ *H01S 5/18* (2013.01); *H01S 5/026* (2013.01); *H01S 5/3432* (2013.01);
(Continued)

(58) Field of Classification Search
CPC .... H01S 5/18; H01S 5/18338; H01S 5/18388; H01S 5/026; H01S 5/04253; H01S 5/183
See application file for complete search history.

(56) References Cited

U.S. PATENT DOCUMENTS 5,627,853 A 5/1997 Mooradian
8,477,821 B2 7/2013 Yoshikawa
(Continued)

FOREIGN PATENT DOCUMENTS

CN 1494188 A 5/2004
JP 2002-374045 A 12/2002
(Continued)

OTHER PUBLICATIONS

International Search Report issued in International Patent Application No. PCT/JP2022/000513 on Mar. 22, 2022 and English translation of same. 5 pages.
(Continued)

*Primary Examiner* — Xinning(Tom) Niu
(74) *Attorney, Agent, or Firm* — K&L Gates LLP

(57) ABSTRACT

[Object] To provide a laser device that has a concave mirror structure and exhibits excellent optical characteristics, a laser device array, and a method of producing the laser device.
[Solving Means] A laser device according to the present technology includes: a first light-reflecting layer; a second light-reflecting layer; and a stacked body. The stacked body includes an active layer, a lens being provided on a first surface on a side of the first light-reflecting layer. The lens has a lens shape protruding toward a side of the first light-reflecting layer with a first direction as a longitudinal direction and a second direction as a lateral direction, a central portion of the lens in the first direction having a first width that is the shortest width along the second direction, a non-central portion of the lens in the first direction having
(Continued)

a second width that is the largest width along the second direction, the lens having a shape in which a height thereof is uniform or the central portion is higher than an end portion, a radius of curvature of an apex of the lens in the second direction being uniform. The first light-reflecting layer is stacked on the first surface to form a concave mirror having a concave surface shape on the lens.

20 Claims, 33 Drawing Sheets

(51) Int. Cl.
*H01S 5/18* (2021.01)
*H01S 5/343* (2006.01)
*H01S 5/42* (2006.01)

(52) U.S. Cl.
CPC ........ *H01S 5/3434* (2013.01); *H01S 5/34353* (2013.01); *H01S 5/34373* (2013.01); *H01S 5/42* (2013.01)

(56) References Cited

U.S. PATENT DOCUMENTS

2002/0039376 A1* 4/2002 Kim .................... H01S 5/18388 372/50.23
2002/0186737 A1 12/2002 Marion
2011/0182314 A1 7/2011 Yoshikawa et al.
2013/0223466 A1 8/2013 Gronenborn et al.
2018/0301871 A1 10/2018 Dummer
2019/0089127 A1 3/2019 Gazula
2020/0014173 A1 1/2020 Lee
2020/0112141 A1 4/2020 Soto et al.
2020/0169061 A1* 5/2020 Mitomo .............. H01S 5/04253
2020/0303896 A1* 9/2020 Ohta ....................... B25J 19/022
2020/0366067 A1* 11/2020 David ..................... B82Y 20/00
2021/0013703 A1* 1/2021 Numata ................ H01S 3/1643

FOREIGN PATENT DOCUMENTS

JP 2011-151293 A 8/2011
JP 2013-541854 A 11/2013
JP 7556362 B2 9/2024
JP 7632310 B2 2/2025
JP 7754085 B2 10/2025
TW 201939833 A 10/2019
WO WO/2018083877 A1 5/2018
WO WO/2018221042 A1 12/2018
WO WO/2019056012 A1 3/2019
WO WO/2020246280 A1 12/2020

OTHER PUBLICATIONS

Written opinion issued in International Patent Application No. PCT/JP2022/000513 on Mar. 22, 2022. 3 pages.
Grunwald et al:"Microlens arrays formed by crossed thin-film deposition of cylindrical microlenses", Diffractive Optics and Micro-Optics: Summaries of the Papers Presented at the Topical Meeting, Apr. 29-May 2, 1996, pp. 27-30, vol. 5, XP055264501.
Koyama Fumio: "Advances and new functions of VCSEL photonics", Optical Review, Springer Verlag, Nov. 27, 2014, vol. 21, No. 6, pp. 893-904, XP035376223.

* cited by examiner

LASER DEVICE, LASER DEVICE ARRAY, AND METHOD OF PRODUCING A LASER DEVICE

TECHNICAL FIELD

The present technology relates to a laser device that emits laser light in a direction perpendicular to a layer surface, a laser device array, and a method of producing the laser device.

BACKGROUND ART

One type of laser device is a VCSEL (Vertical Cavity Surface Emitting Laser) device. The VCSEL device has a structure in which a light-emitting layer is sandwiched between a pair of reflection mirrors. A current confinement structure is provided in the vicinity of the light-emitting layer, and a current concentrates in a partial region in the light-emitting layer by the current confinement structure to generate spontaneous emission light. The pair of reflection mirrors forms a resonator and reflects light of a predetermined wavelength, of the spontaneous emission light, toward the light-emitting layer to cause laser oscillation.

In the VCSEL device, the resonator length that is the distance between the pair of reflection mirrors increases, the diffraction loss due to optical field confinement in the lateral direction (layer surface direction) increases. As a method of nullifying this diffraction loss, a structure in which a concave mirror having a spherical shape is provided as one of the pair of reflection mirrors has been proposed (see Patent Literature 1).

CITATION LIST

Patent Literature

Patent Literature 1: WO 2018/083877

DISCLOSURE OF INVENTION

Technical Problem

In the proposal described in Patent Literature 1, a method of applying heat treatment to a fluid material patterned on a substrate to form the fluid material in a convex spherical shape and forming a concave mirror using the convex spherical shape is used. However, in this method, there is a problem that the shape of the fluid material does not become a convex spherical shape but becomes a flat or concave shape due to the influence of tension of the substrate surface and the fluid material and gravity.

For example, in the case where the diameter of the patterned fluid material is large, the capillary action is disturbed due to the influence of gravity, which results in a flat or concave shape. Further, in the case where the fluid material is thinned, the contact angle between the substrate surface and the fluid material cannot be made smaller than a certain value due to the tension of the substrate surface and the fluid material, and the shape of the fluid material becomes a flat or concave shape. When the shape of the fluid material is a flat or concave shape, desired optical characteristics by the concave mirror cannot be achieved.

In view of the circumstances as described above, it is an object of the present technology to provide a laser device that has a concave mirror structure and exhibits excellent optical characteristics, a laser device array, and a method of producing the laser device.

Solution to Problem

In order to achieve the above-mentioned object, a laser device according to the present technology includes: a first light-reflecting layer; a second light-reflecting layer; and a stacked body.

The first light-reflecting layer reflects light of a specific wavelength.

The second light-reflecting layer reflects light of the wavelength.

The stacked body includes a first semiconductor layer, a second semiconductor layer, and an active layer, is disposed between the first light-reflecting layer and the second light-reflecting layer, and has a first surface on a side of the first light-reflecting layer and a second surface on a side of the second light-reflecting layer, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination, a lens being provided on the first surface.

The lens has a lens shape protruding toward a side of the first light-reflecting layer with a first direction as a longitudinal direction and a second direction as a lateral direction, the first direction being parallel to a plane perpendicular to an optical axis direction of emitted light, the second direction being parallel to the plane and orthogonal to the first direction, a central portion of the lens in the first direction having a first width that is the shortest width along the second direction, a non-central portion of the lens in the first direction having a second width that is the largest width along the second direction, the lens having a shape in which a height thereof from the plane is uniform or the central portion is higher than an end portion, a radius of curvature of an apex of the lens in the second direction being uniform.

The first light-reflecting layer is stacked on the first surface to form a concave mirror having a concave surface shape on the lens. Note that in the present specification, the phrase that the height or radius of curvature is "uniform" means that the value does not exceed ±20% of the average value at the apex of a predetermined concave mirror in substantially all portions.

The stacked body may have a current confinement structure that confines a current and forms a current injection region where a current concentrates, and the current injection region may have a shape in which a plane figure thereof when viewed from the optical axis direction overlaps the lens when viewed from the optical axis direction with the first direction as a longitudinal direction and the second direction as a lateral direction.

A length of the lens along the first direction may be greater than the second width.

A length of the lens along the first direction may be 40 μm or more.

The second width of the lens may be 10 μm or more.

A resonator length of the laser device may be a distance between the concave mirror and the second light-reflecting layer, and the radius of curvature may be equal to or greater than the resonator length.

A surface accuracy of a surface of the lens may be 1.0 nm or less in RMS (Root Mean Square).

The first semiconductor layer and the second semiconductor layer may be formed of GaN.

The first semiconductor layer and the second semiconductor layer may be formed of GaAs.

The first semiconductor layer and the second semiconductor layer may be formed of InP.

The laser device may further include a wavelength conversion layer that is provided on a side of the second light-reflecting layer opposite to the stacked body and is formed of a wavelength conversion material.

The first light-reflecting layer and the second reflecting layer may each be a DBR (Distributed Bragg Reflector) including a multilayer light-reflecting film.

In order to achieve the above-mentioned object, a laser device array according to the present technology is a laser device array in which a plurality of laser devices that can be individually driven are arranged, the laser device including a first light-reflecting layer that reflects light of a specific wavelength, a second light-reflecting layer that reflects light of the wavelength, and a stacked body that includes a first semiconductor layer, a second semiconductor layer, and an active layer, is disposed between the first light-reflecting layer and the second light-reflecting layer, and has a first surface on a side of the first light-reflecting layer and a second surface on a side of the second light-reflecting layer, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination, a lens being provided on the first surface, the lens having a lens shape protruding toward a side of the first light-reflecting layer with a first direction as a longitudinal direction and a second direction as a lateral direction, the first direction being parallel to a plane perpendicular to an optical axis direction of emitted light, the second direction being parallel to the plane and orthogonal to the first direction, a central portion of the lens in the first direction having a first width that is the shortest width along the second direction, a non-central portion of the lens in the first direction having a second width that is the largest width along the second direction, the lens having a shape in which a height thereof from the plane is uniform or the central portion is higher than an end portion, a radius of curvature of an apex of the lens in the second direction being uniform, the first light-reflecting layer being stacked on the first surface to form a concave mirror having a concave surface shape on the lens.

In order to achieve the above-mentioned object, a method of producing a laser device according to the present technology includes:

preparing a stacked body that includes a first semiconductor layer, a second semiconductor layer, and an active layer, and has a first surface and a second surface, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination;

forming, on the first surface, a structure that is formed of a fluid material and has a certain thickness with a first direction as a longitudinal direction and a second direction as a lateral direction, the first direction being parallel to a plane perpendicular to an optical axis direction of emitted light, the second direction being parallel to the plane and orthogonal to the first direction, a central portion of the structure in the first direction having a first width that is the shortest width along the second direction, a non-central portion of the structure in the first direction having a second width that is the largest width along the second direction;

deforming the structure by heating the structure to flow the fluid material and using a shape of the structure to form, on the first surface, a lens having a shape in which a height thereof from the plane is uniform or a central portion thereof is higher than an end portion, a radius of curvature of an apex of the lens in the second direction being uniform;

stacking, on the first surface, a first light-reflecting layer that reflects light of a specific wavelength to form a concave mirror having a concave surface shape on the lens; and forming a second light-reflecting layer that reflects light of the wavelength on a side of the second surface of the stacked body.

The step of forming a lens may include deforming the structure into a lens shape protruding toward a side of the first light-reflecting layer with the first direction as a longitudinal direction and the second direction as a lateral direction, the central portion having the first width, the non-central portion having the second width, the structure having a shape in which a height thereof from the plane is uniform or the central portion is higher than an end portion, a radius of curvature of an apex of the structure in the second direction being uniform.

The step of forming a lens may include etching the stacked body using the structure deformed into the shape as an etching mask to form the lens on the first surface.

The step of forming a lens may include using, as the lens, the structure deformed into the shape.

A length of the structure along the first direction may be greater than the second width.

A length of the structure along the first direction may be 40 μm or more.

The etching may be dry etching or wet etching.

MODE(S) FOR CARRYING OUT THE INVENTION

First Embodiment

Figure 1:
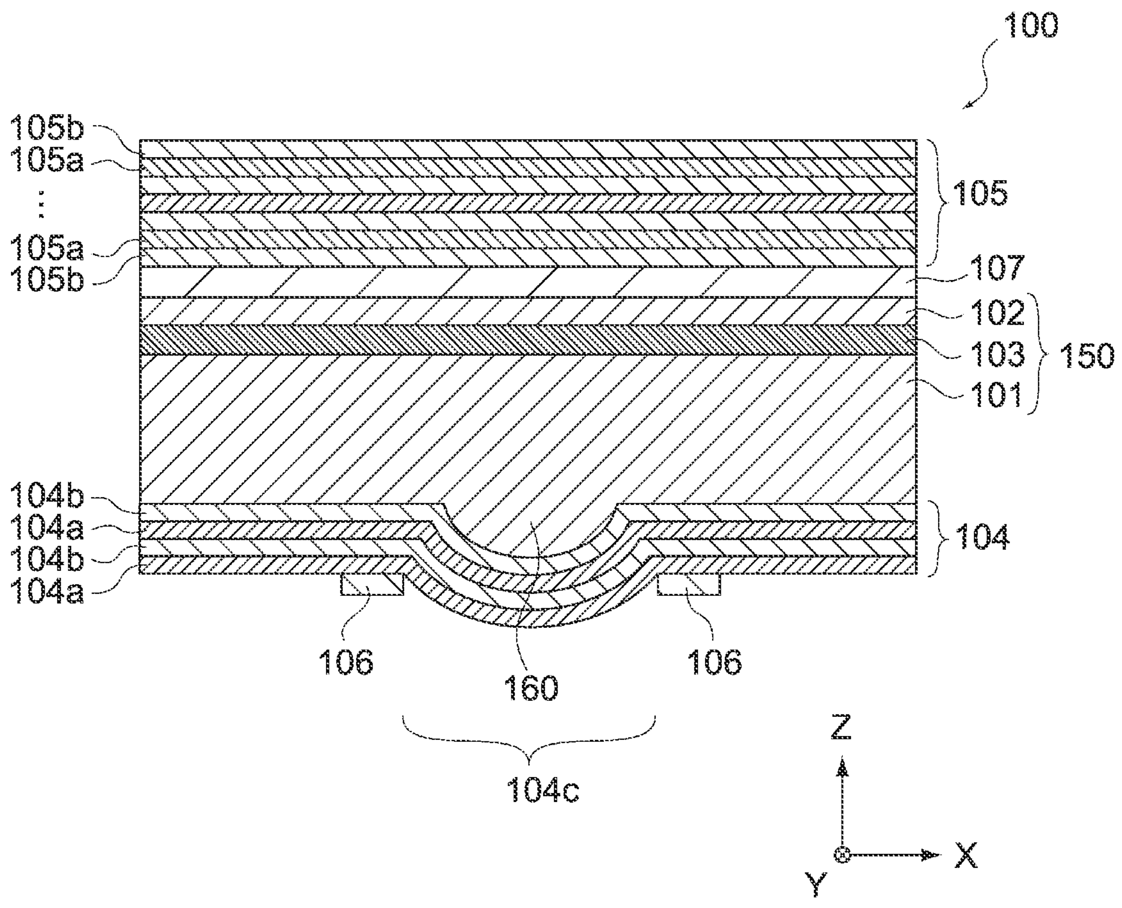
FIG. 1 is a cross-sectional view of a laser device according to a first embodiment of the present technology.

A laser device according to a first embodiment of the present technology will be described. In the drawings of the present disclosure, an optical axis direction of light emitted from a laser device is defined as a Z direction, one direction orthogonal to the Z direction is defined as an X direction, and a direction orthogonal to the Z direction and the X direction is defined as a Y direction. The laser device according to this embodiment has a structure similar to that of a VCSEL (Vertical Cavity Surface Emitting Laser) device. However, the VCSEL device has a structure in which light resonates in the Z direction, and the laser device according to this embodiment is different from the VCSEL device in that resonance occurs also in another direction (Y direction) in addition to the Z direction.

[Structure of Laser Device]

Figure 2:
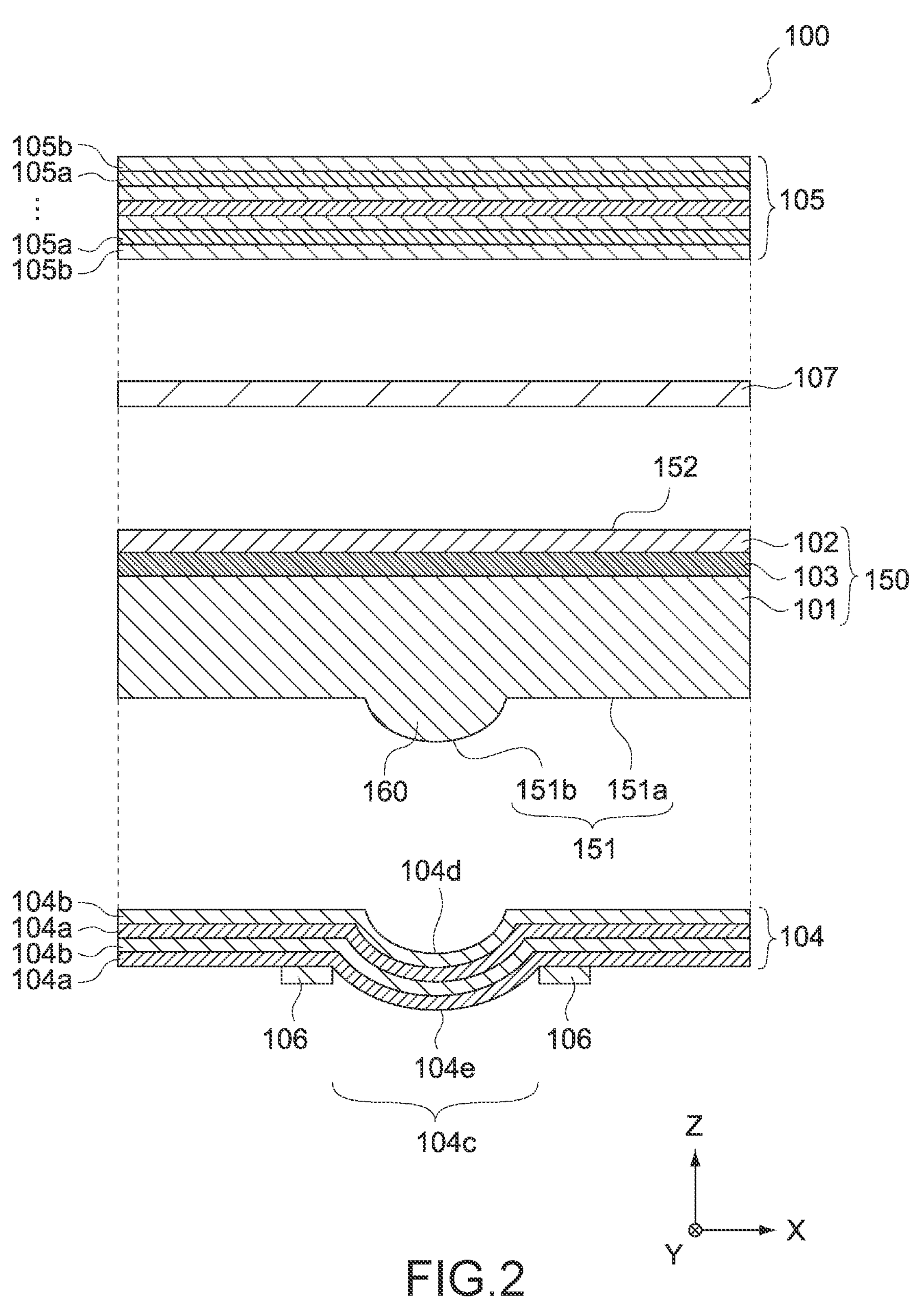
FIG. 2 is an exploded cross-sectional view of a partial configuration of the laser device.

FIG. 1 is a cross-sectional view of a laser device 100 according to this embodiment, and FIG. 2 is an exploded schematic diagram showing the laser device 100. As shown in these figures, the laser device 100 includes a first semiconductor layer 101, a second semiconductor layer 102, an active layer 103, a first light-reflecting layer 104, a second light-reflecting layer 105, a first electrode 106, and a second electrode 107. Of these, the first semiconductor layer 101, the second semiconductor layer 102, and the active layer 103 are collectively referred to as a stacked body 150.

Each of these layers has a layer surface direction along the X-Y plane, and the first electrode 106, the first light-reflecting layer 104, the first semiconductor layer 101, the active layer 103, the second semiconductor layer 102, the second electrode 107, and the second light-reflecting layer 105 are stacked in this order. Therefore, the stacked body 150 is stacked between the first light-reflecting layer 104 and the second light-reflecting layer 105.

The first semiconductor layer 101 is a layer that is formed of a semiconductor having a first conductivity type and transports carriers to the active layer 103. The first conductivity type can be an n-type, and the first semiconductor layer 101 can include, for example, an n-GaN substrate. A lens 160 is provided in the first semiconductor layer 101. This lens 160 will be described below. The second semiconductor layer 102 is a layer that is formed of a semiconductor having a second conductivity type and transports carriers to the active layer 103. The second conductivity type can be a p-type, and the second semiconductor layer 102 can be formed of, for example, p-GaN.

The active layer 103 is a layer that is disposed between the first semiconductor layer 101 and the second semiconductor layer 102 and emits light by carrier recombination. The active layer 103 has a multiple quantum well structure in which a quantum well layer and a barrier layer are alternately stacked to obtain a plurality of layers, the quantum well layer can be formed of, for example, InGaN, and the barrier layer can be formed of, for example, GaN. Further, the active layer 103 only needs to be a layer that emits light by carrier recombination instead of the multiple quantum well structure.

As shown in FIG. 2, of surfaces of the stacked body 150, a surface on the side of the first light-reflecting layer 104 is defined as a first surface 151 and a surface on the side of the second light-reflecting layer 105 is defined as a second surface 152. The lens 160 is provided on the first surface 151. As a result, the first surface 151 has a main surface 151*a* and a lens surface 151*b*. The main surface 151*a* is a plane (X-Y plane) perpendicular to the optical axis direction (Z direction) of emitted light. The lens surface 151*b* is a surface of the lens 160 and is a surface protruding from the main surface 151*a*.

The first light-reflecting layer 104 reflects light of a specific wavelength (hereinafter, a wavelength λ) and causes light of a wavelength other than that to be transmitted therethrough. The wavelength λ is, for example, 445 nm. As shown in FIG. 1, the first light-reflecting layer 104 can be a DBR (Distributed Bragg Reflector) including a multilayer light-reflecting film in which a high-refractive index layer 104*a* and a low-refractive index layer 104*b* having an optical film thickness of λ/4 are alternately stacked to obtain a plurality of layers. The first light-reflecting layer 104 can have, for example, a layered structure of $Ta_2O_5/SiO_2$, $SiO_2/SiN$, $SiO_2/Nb_2O_5$, or the like.

The first light-reflecting layer 104 includes a concave mirror 104*c*. The first light-reflecting layer 104 is stacked on the first surface 151 of the stacked body 150 to have a certain thickness. As shown in FIG. 2, the surface of the first light-reflecting layer 104 on the side of the stacked body 150 forms a concave surface 104*d* and the surface opposite to the stacked body 150 forms a convex surface 104*e* in accordance with the shape of the lens 160. As a result, the concave mirror 104*c* is formed in the first light-reflecting layer 104.

The second light-reflecting layer 105 reflects light of the wavelength λ and causes light of a wavelength other than that to be transmitted therethrough. As shown in FIG. 1, the second light-reflecting layer 105 can be a DBR (Distributed Bragg Reflector) including a multilayer light-reflecting film in which a high-refractive index layer 105*a* and a low-refractive index layer 105*b* having an optical film thickness of λ/4 are alternately stacked to obtain a plurality of layers. The second light-reflecting layer 105 can have, for example, a layered structure of $Ta_2O/SiO_2$, $SiO_2/SiN$, $SiO_2/Nb_2O_5$, or the like.

The first electrode 106 is provided around the concave mirror 104*c* on the first light-reflecting layer 104 and functions as one electrode of the laser device 100. The first electrode 106 can include, for example, a single-layer metal film formed of Au, Ni, Ti, or the like, or a multiplayer metal film formed of Ti/Au, Ag/Pd, Ni/Au/Pt, or the like.

The second electrode 107 is disposed between the second semiconductor layer 102 and the second light-reflecting layer 105 and functions as the other electrode of the laser device 100. The second electrode 107 can be formed of, for example, a transparent conductive material such as ITO (Indium Tin Oxide), ITiO (Indium Titan Oxide), TiO, AZO (Aluminum doped zinc oxide), ZnO, SnO, ZSnO, $SnO_2$, $SnO_3$, TiO, $TiO_2$, and graphene.

Figure 3:
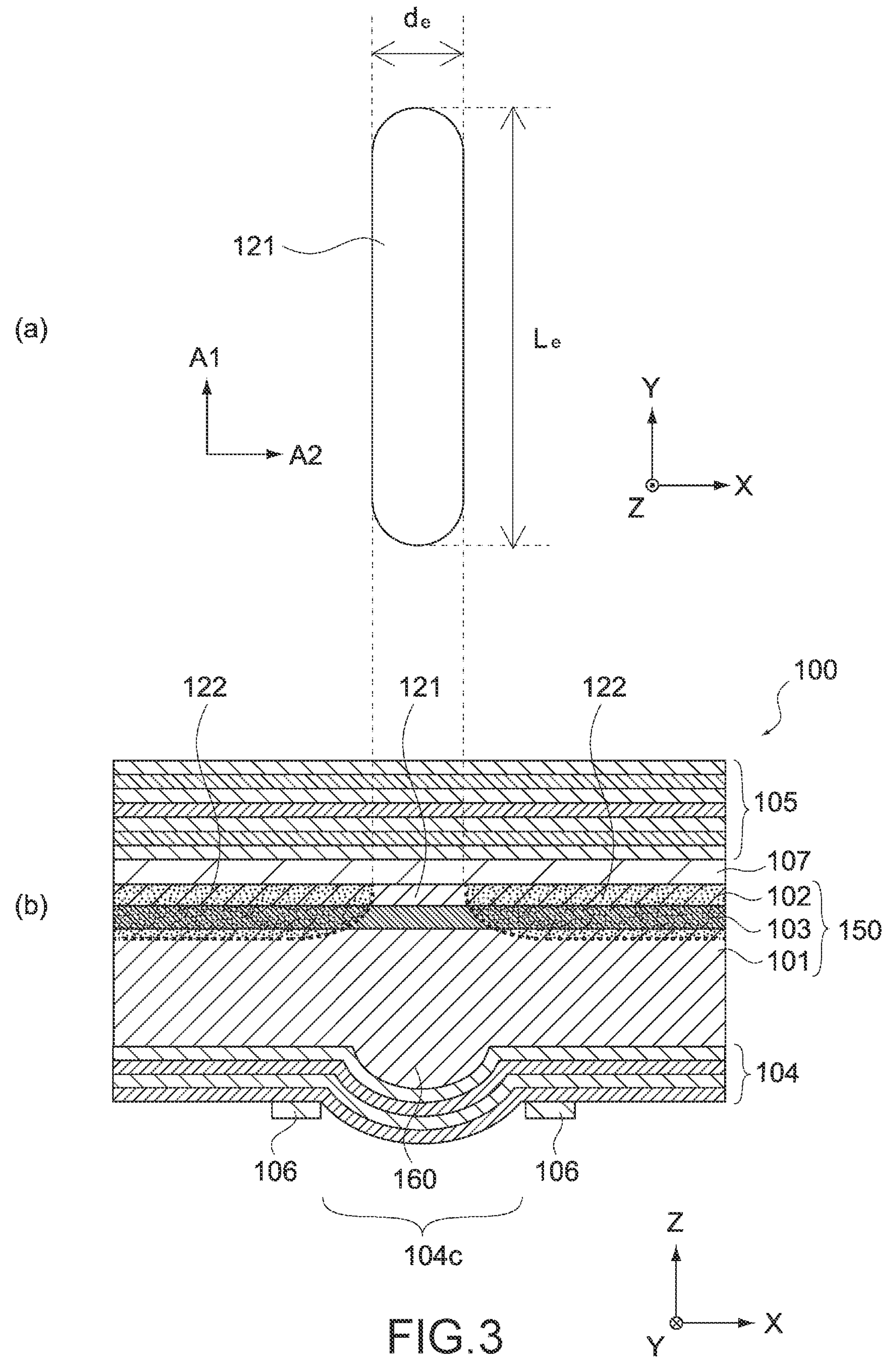
FIG. 3 is a schematic diagram showing a current injection region of the laser device.
Figure 4:
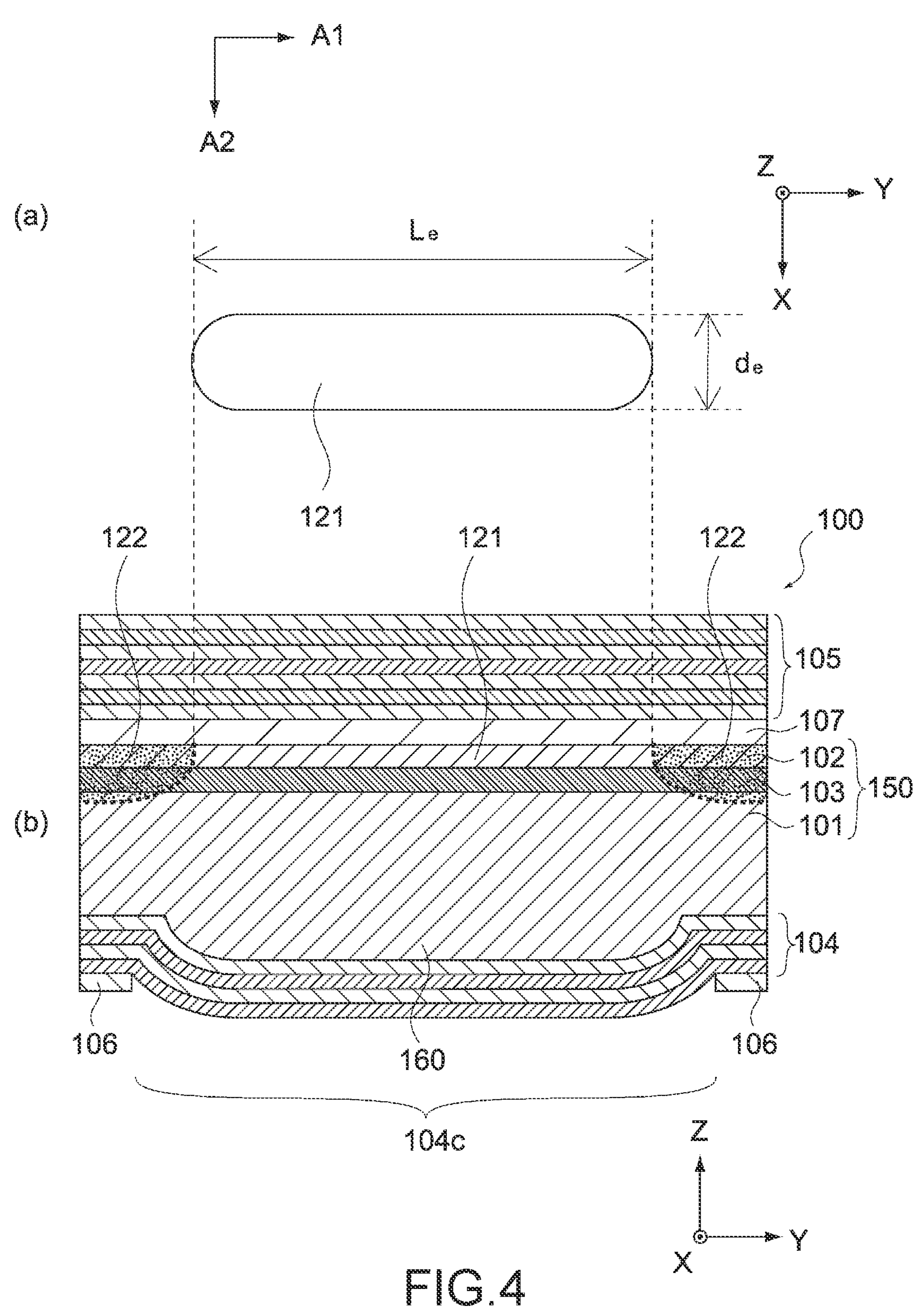
FIG. 4 is a schematic diagram showing the current injection region of the laser device.

In the laser device 100, a current confinement structure is formed in the stacked body 150. FIG. 3 and FIG. 4 are each a schematic diagram showing a current confinement structure. Part (a) of FIG. 3 and Part (a) of FIG. 4 are each a plan view of the current confinement structure when viewed from the optical axis direction (Z direction). Part (b) of FIG. 3 is a cross-sectional view of the X-Z cross section showing the current confinement structure, and Part (b) of FIG. 4 is a cross-sectional view of the Y-Z cross section showing the current confinement structure. As shown in Part (b) of FIG. 3 and Part (b) of FIG. 4, the current confinement structure has a current injection region 121 and an insulation region 122 (dotted region). The current injection region 121 is a region into which ions are not implanted (non-ion-implantation region) and is a region having conductivity.

The insulation region 122 is a region surrounding the current injection region 121 in the layer surface direction (X-Y direction) and is a region (ion implantation region) that is insulated by implanting ions into the semiconductor material forming the stacked body 150. The ions to be implanted into the insulation region 122 can be B (boron) ions. Further, ions capable of insulating the semiconductor material, such as O (oxygen) ions and H (hydrogen) ions, may be used instead of the B ions.

As shown in Part (a) of FIG. 3 and Part (a) of FIG. 4, the current injection region 121 has an elongated plane shape with one direction (Y direction) as the longitudinal direction and the direction (X direction) orthogonal to the longitudinal direction as the lateral direction. Hereinafter, the longitudinal direction (Y direction) of the current injection region 121 will be referred to as a first direction A1 and the lateral direction (X direction) of the current injection region 121 will be referred to as a second direction A2. The first direction A1 and the second direction A2 are orthogonal to the optical axis direction (Z direction) and are directions orthogonal to each other.

As shown in Part (a) of FIG. 3 and Part (a) of FIG. 4, when the length of the current injection region 121 along the first direction A1 is defined as a length $L_e$ and the width along the second direction A2 is defined as a width $d_e$, the length $L_e$ is suitably three times or more the width $d_e$, and more suitably 20 times or more. Specifically, the length $L_e$ is suitably 40 μm or more.

A current flowing through the laser device 100 cannot pass through the insulation region 122 and concentrates in the current injection region 121. That is, a current confinement structure is formed by the current injection region 121 and the insulation region 122. Note that the insulation region 122 does not need to be provided in all of the first semiconductor layer 101, the active layer 103, and the second semiconductor layer 102 and only needs to be provided in at least one of these layers.

Note that the plane shape of the current injection region 121 when viewed from the optical axis direction (Z direction) shown in Part (a) of FIG. 3 and Part (a) of FIG. 4 is a plane figure of a portion of the current injection region 121 having the smallest diameter in the layer surface direction (X-Y direction) as shown in Part (b) of FIG. 3 and Part (b) of FIG. 4. Since the diameter of the current injection region 121 increases as away from the interface between the second semiconductor layer 102 and the second electrode 106, the plane shape of the current injection region 121 is the shape of the current injection region 121 at the same interface.

[Regarding Lens Shape]

Figure 5:
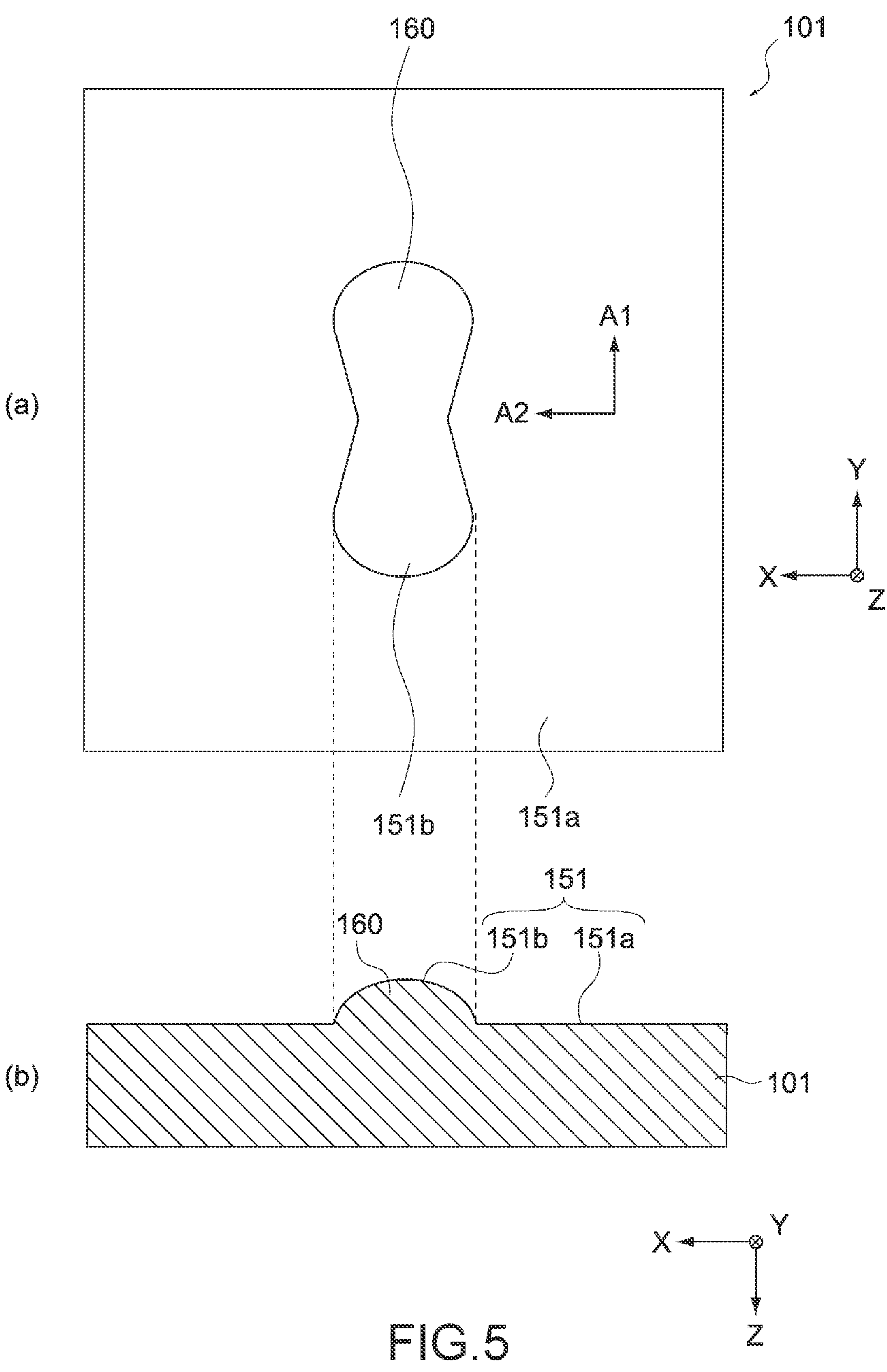
FIG. 5 is a plan view of a lens included in the laser device.
Figure 6:
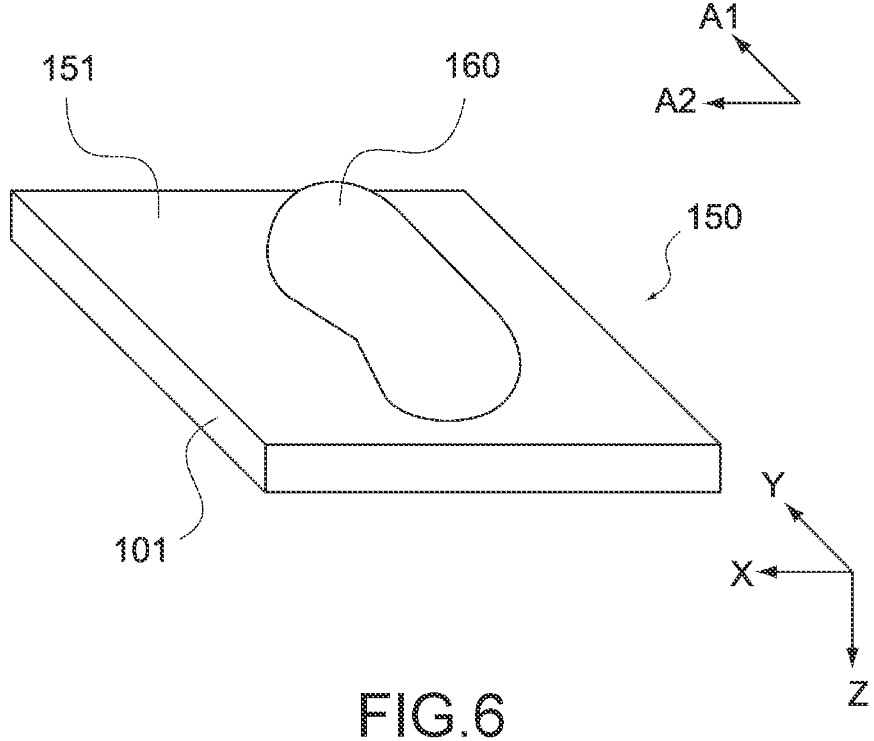
FIG. 6 is a perspective view of the lens included in the laser device.
Figure 7:
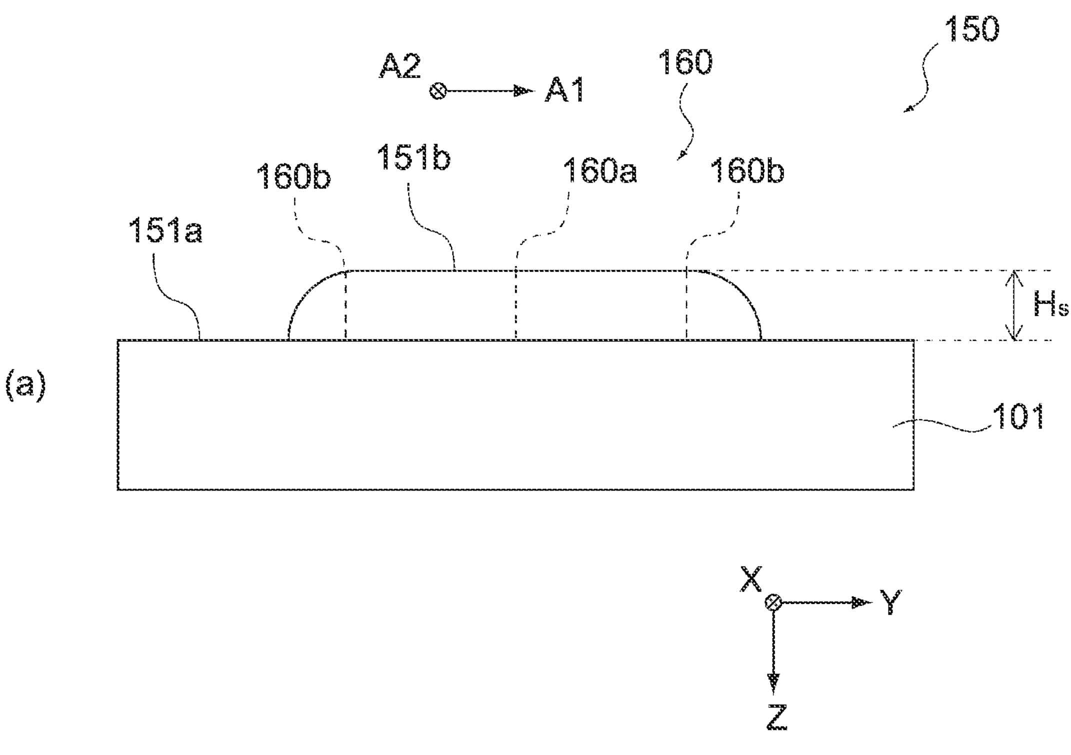
FIG. 7 is a plan view of the lens included in the laser device.
Figure 7:
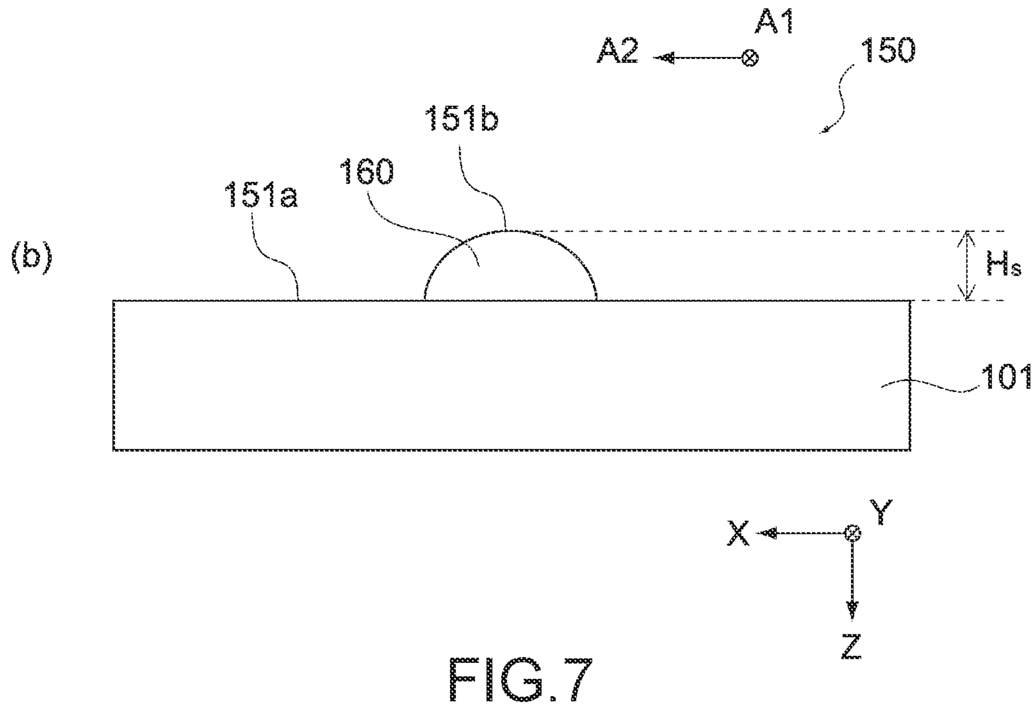

A shape of the lens 160 will be described. FIG. 5 to FIG. 7 are each a schematic diagram showing a shape of the lens 160. Part (a) of FIG. 5 is a cross-sectional view of the first semiconductor layer 101 when viewed from the optical axis direction (Z direction), and Part (b) of FIG. 5 is a cross-sectional view of the first semiconductor layer 101. FIG. 6 is a perspective view of the lens 160. Part (a) of FIG. 7 is a plan view of the lens 160 when viewed from the X direction, and Part (b) of FIG. 7 is a plan view of the lens 160 when viewed from the Y direction. As shown in FIG. 5 to FIG. 7, the lens 160 is provided to protrude toward the side of the first light-reflecting layer 104 from the main surface 151*a* parallel to the X-Y plane. Hereinafter, the main surface 151*a* will be referred to as a "plane" for defining the shape of the lens 160.

As shown in FIG. 5, the lens 160 has an elongated lens shape with one direction (Y direction) parallel to the main surface 151*a* as the longitudinal direction and the direction (X direction) orthogonal to the longitudinal direction as the lateral direction. The longitudinal direction (Y direction) of the lens 160 matches the first direction A1 that is the longitudinal direction of the current injection region 121 (see FIG. 3), and the lateral direction (X direction) of the lens 160 matches the second direction A2 that is the lateral direction of the current injection region 121. That is, the lens 160 has the first direction A1 as the longitudinal direction and the second direction A2 as the lateral direction.

Figure 8:
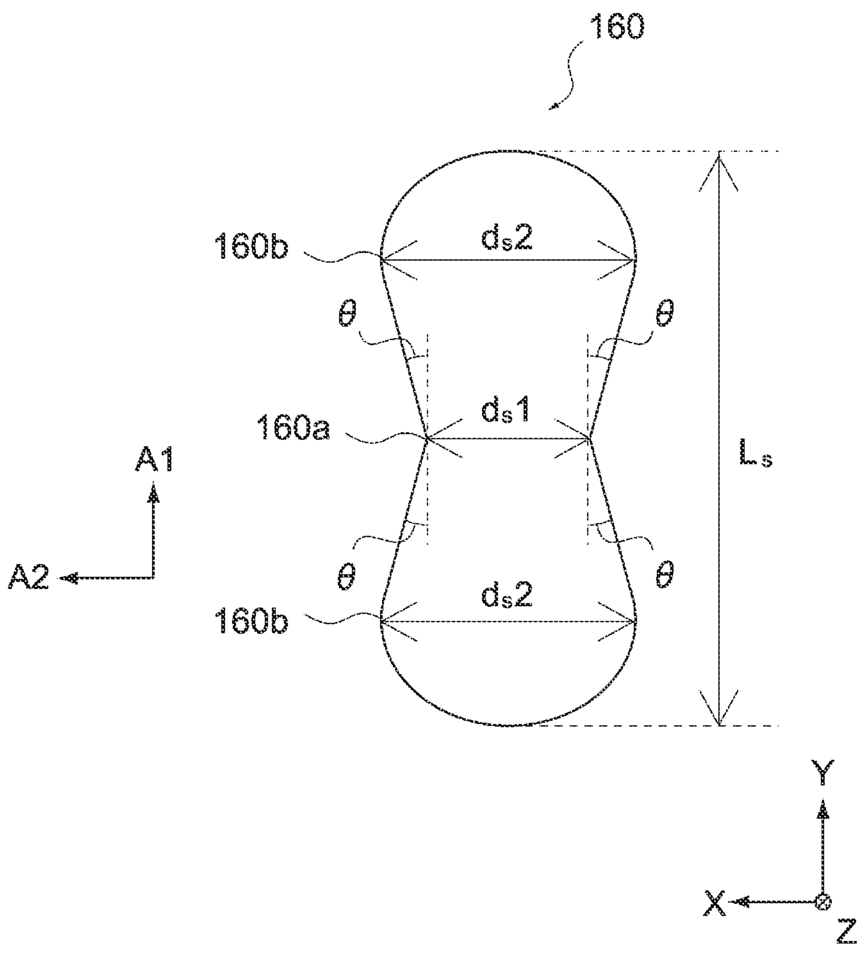
FIG. 8 is a schematic diagram showing a shape of the lens included in the laser device.

FIG. 8 is a schematic diagram showing the shape of the lens 160 when viewed from the optical axis direction (Z direction). As shown in the figure, the lens 160 includes a central portion 160*a* and a non-central portion 160*b*. The central portion 160*a* is a portion of the lens 160 located in the center in the first direction A1. When the width of the central portion 160*a* along the second direction A2 is defined as a first width $d_s$1, the first width $d_s$1 is the shortest width of the lens 160 along the second direction A2. The first width $d_s$1 can be, for example, 36 μm.

Further, the non-central portion 160*b* is a portion of the lens 160 located away from the central portion 160*a* in the first direction A1 and is a portion of the lens 160 near both ends. When the width of the non-central portion 160*b* along the second direction A2 is defined as a second width $d_s$2, the second width $d_s$2 is the largest width of the lens 160 along the second direction A2. The second width $d_s$2 is suitably 10 μm or more, and can be, for example, 40 μm.

In the lens 160, a portion between the central portion 160*a* and the non-central portion 160*b* can have a shape in which the width along the second direction A2 gradually decreases from the non-central portion 160*b* to the central portion 160*a*, as shown in FIG. 8. An angle θ formed between the peripheral edge of the lens 160 and the first direction A1 when viewed from the optical axis direction (Z direction) can be, for example, 3.8°. Further, as shown in FIG. 8, when the length of the lens 160 along the first direction A1 is defined as a length Ls, the length Ls is suitably larger than the second width $d_s$2 and is suitably 40 μm or more. The length Ls can be, for example, 100 μm.

Figure 9:
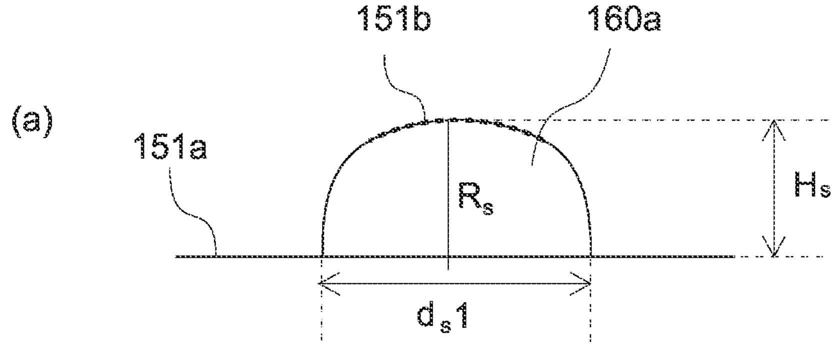
FIG. 9 is a schematic diagram showing the cross-sectional shape of a central portion and a non-central portion of the lens included in the laser device.
Figure 9:
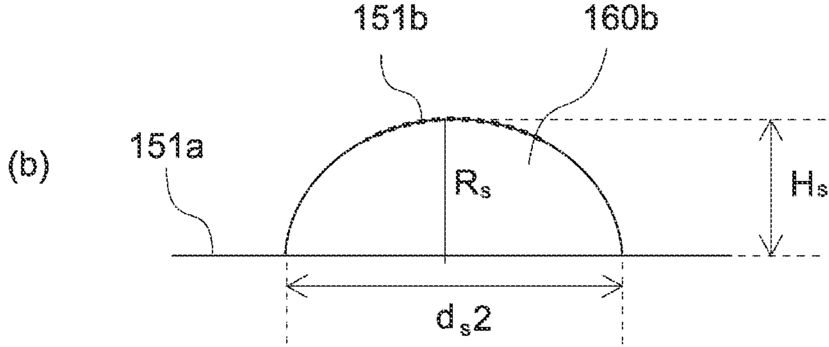
Figure 9:
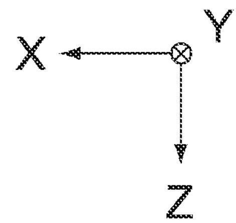

FIG. 9 is a schematic diagram showing the shapes of the central portion 160*a* and the non-central portion 160*b*, Part (a) of FIG. 9 shows the cross-sectional shape of the central portion 160*a* taken along the X-Z plane, and Part (b) of FIG. 9 shows the cross-sectional shape of the non-central portion 160*b* taken along the X-Z plane. As shown in Part (a) of FIG. 9 and Part (b) of FIG. 9, the central portion 160*a* and the non-central portion 160*b* can have a shape in which the peripheral edge in the X-Z cross section has a curved line, the shape of the curved line differs between the central portion 160*a* and the non-central portion 160*b*. In the portion between the central portion 160*a* and the non-central portion 160*b*, the curved line drawn by the peripheral edge in the X-Z cross section has an intermediate shape between those in Part (a) of FIG. 9 and Part (b) of FIG. 9.

As shown in FIG. 7 and FIG. 9, the height of the lens 160 from the main surface 151*a* (in the Z direction) is defined as a height $H_s$. As shown in Parts (a) and (b) of FIG. 9, both the central portion 160*a* and the non-central portion 160*b* have the height $H_s$. Further, the portion between the central portion 160*a* and the non-central portion 160*b* also has the height $H_s$, and the lens 160 has the height $H_s$ that is uniform, as shown in FIG. 7. Note that the height $H_s$ is suitably 10 nm or more. Further, the lens 160 may have a shape in which the height of the central portion 160*a* from the main surface 151*a* is greater than the height of the end portion from the main surface 151*a*. The end portion is a portion located near both ends of the lens 160*a* in the first direction A1, and is, for example, the non-central portion 160*b*.

Further, in the lens 160, an apex of the lens surface 152*b* (hereinafter, an apex of the lens) has a radius of curvature (ROC) $R_s$ in the second direction A2. In Parts (a) and (b) of FIG. 9, the apex of the lens is indicated by a broken line, and the radius of curvature $R_s$ of the apex of the lens in the second direction A2 is shown. As shown in Parts (a) and (b) of FIG. 9, in both the central portion 160*a* and the non-central portion 160*b*, the apex of the lens has the same radius of curvature $R_s$. Further, the portion between the central portion 160*a* and the non-central portion 160*b* also has the radius of curvature $R_s$. In the lens 160, the apex of the lens has the radius of curvature $R_s$ that is uniform in the second direction A2.

Figure 10:
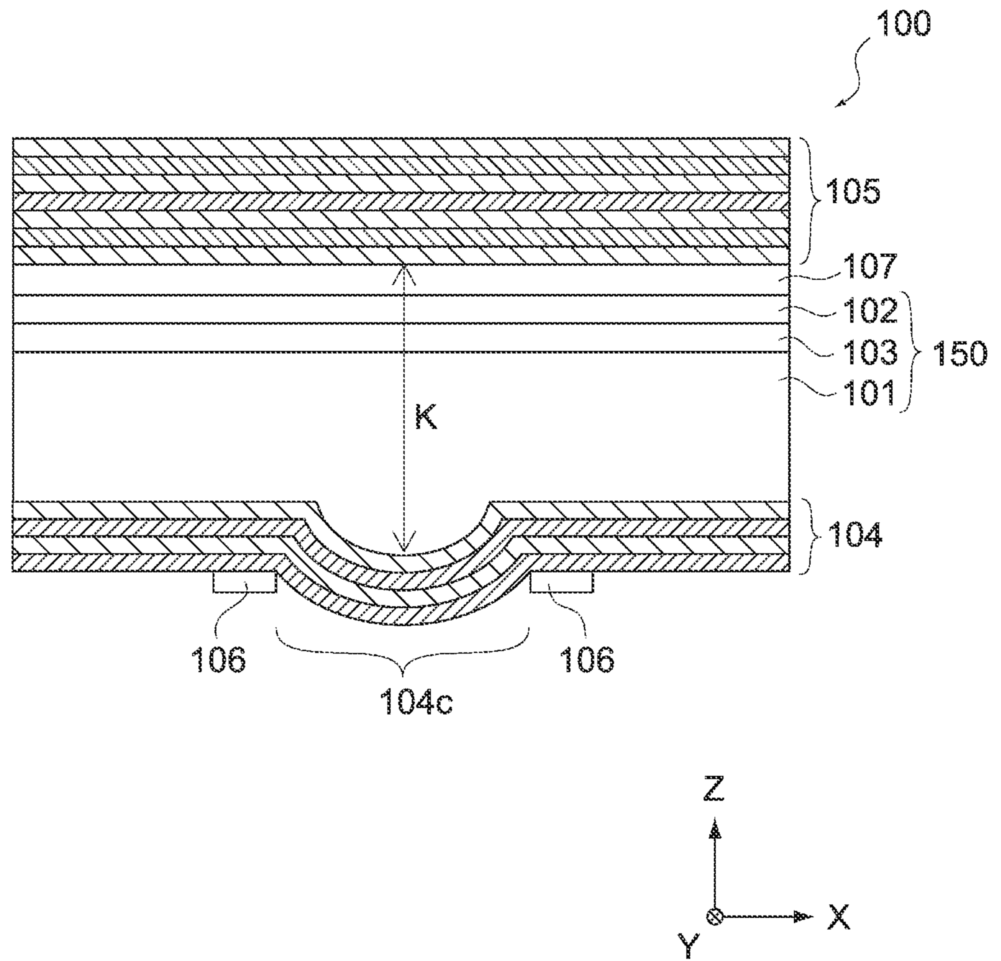
FIG. 10 is a schematic diagram showing a resonator length in the laser device.

This radius of curvature $R_s$ is suitably equal to or greater than the resonator length of the laser device 100. FIG. 10 is a schematic diagram showing a resonator length K of the laser device 100. As shown in the figure, the resonator length K of the laser device 100 is a distance between the concave mirror 104*c* and the second light-reflecting layer 105. The radius of curvature $R_s$ is suitably the resonator length K or more, may be the same as the resonator length K, or may be greater than the resonator length K. This is because when the radius of curvature $R_s$ is less than the resonator length K, laser oscillation described below does not occur. The resonator length K can be, for example, 25 μm, and the radius of curvature $R_s$ can be, for example, 44 μm.

Further, in the lens 160, the surface accuracy (RMS) of the lens surface 152*b* is suitably 1.0 nm or less. This is because when the surface accuracy (RMS) of the lens surface 152*b* exceeds 1.0 nm, optical loss occurs in the lens surface 152*b*. The surface accuracy (RMS) can be, for example, 0.6 nm.

Figure 11:
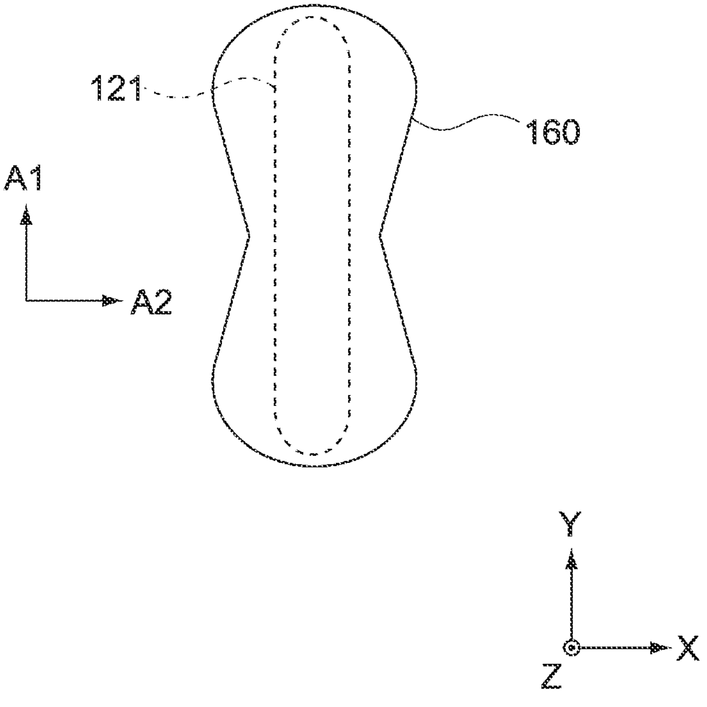
FIG. 11 is a schematic diagram showing a positional relationship between the current injection region and a concave mirror of the laser device.

FIG. 11 is a schematic diagram showing a positional relationship between the lens 160 and the current injection region 121 (see FIG. 3) and is a diagram of the lens 160 and the current injection region 121 when viewed from the optical axis direction (Z direction). As shown in the figure, the position and shape of the lens 160 are formed such that the current injection region 121 overlaps the lens 160 when viewed from the same direction.

Figure 12:
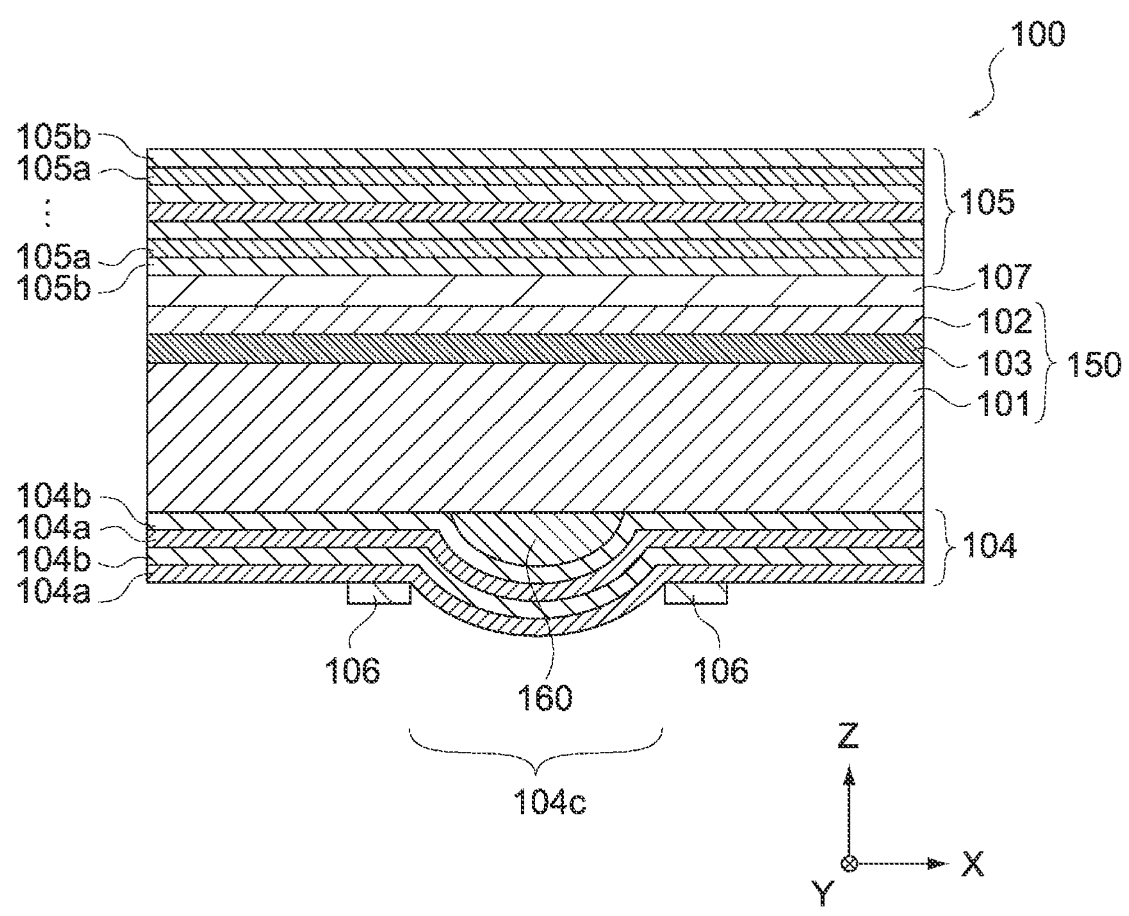
FIG. 12 is a cross-sectional view of the laser device in which the lens includes another member according to the first embodiment of the present technology.

Note that the lens 160 may be formed by part of the first semiconductor layer 101 as shown in FIG. 2, but may include a member different from the first semiconductor layer 101. FIG. 12 is a cross-sectional view showing the lens 160 bonded to the first semiconductor layer 101. As shown in the figure, the lens 160 may include a member bonded to the first semiconductor layer 101.

Further, although the main surface 151*a* parallel to the X-Y plane is defined as the "plane" for defining the shape of the lens 160 in the above description, the main surface 151*a* is not limited to a flat surface parallel to the X-Y plane and may be a curved surface or the like. In this case, a virtual plane parallel to the X-Y plane can be used as the "plane" for defining the shape of the lens 160.

Note that the lens 160 can have a shape in which the peripheral edge in the X-Z cross section has a curved line as described above. The shape drawn by the peripheral edge of the lens 160 in the X-Z cross section can be part of a circle, part of a parabola, part of a sine curve, part of an ellipse, or part of a catenary curve. This shape is strictly not part of a circle, strictly not part of a parabola, strictly not part of a sine curve, strictly not part of an ellipse, or strictly not part of a catenary curve in some cases. That is, the phrase that "the shape is part of a circle, part of a parabola, part of a sine curve, part of an ellipse, or part of a catenary curve" includes a case where the shape is substantially part of a circle, substantially part of a parabola, substantially part of a sine curve, substantially part of an ellipse, or substantially part of a catenary curve. Part of these curves may be replaced with a segment. The shape drawn by the peripheral edge of the lens 160 in the X-Z cross section can be obtained by measuring the shape of the lens surface 152*b* with a measuring instrument and analyzing the obtained data on the basis of the method of least squares.

[Operation of Laser Device]

Figure 13:
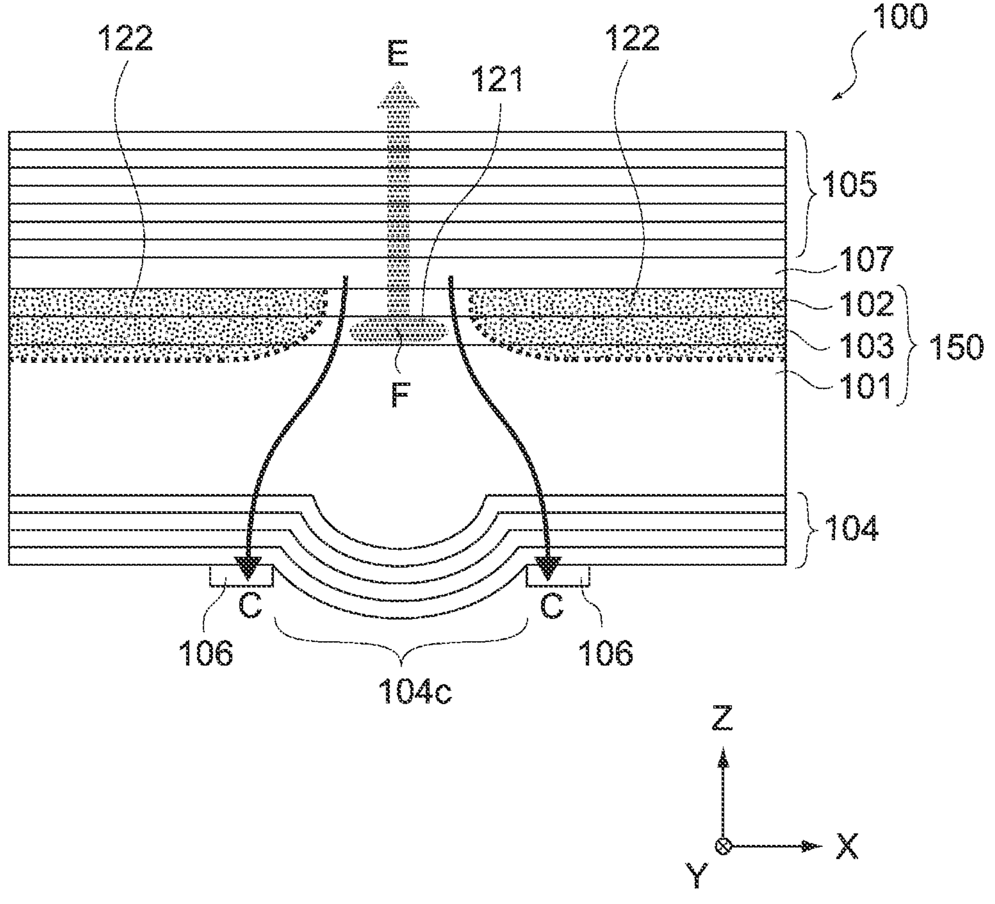
FIG. 13 is a schematic diagram showing an operation of the laser device according to the first embodiment according to the present technology.

An operation of the laser device 100 will be described. FIG. 13 is a schematic diagram showing an operation of the laser device 100. When a voltage is applied between the first electrode 106 and the second electrode 107, a current flows between the first electrode 106 and the second electrode 107. The current is confined by the current confinement structure and injected to the current injection region 121 as shown by arrows C in FIG. 13.

This injected current causes spontaneous emission light F in the vicinity of the current injection region 121 of the active layer 103. The spontaneous emission light F travels in the stacking direction (Z direction) of the laser device 100 and is reflected by the first light-reflecting layer 104 and the second light-reflecting layer 105.

Since the first light-reflecting layer 104 and the second light-reflecting layer 105 are configured to reflect light having the oscillation wavelength λ, the component of the spontaneous emission light having the oscillation wavelength λ forms a standing wave between the first light-reflecting layer 104 and the second light-reflecting layer 105 and is amplified by the active layer 103. When the injected current exceeds a threshold value, light forming a standing wave causes laser oscillation. Laser light E generated thereby is transmitted through the second light-reflecting layer 105 and is emitted from the laser device 100 with the Z direction as the optical axis direction.

Here, in the laser device 100, the current injection region 121 has an elongated plane shape extending along the first direction A1 (Y direction), and the lens 160 also has an elongated shape extending along the first direction A1 (see FIG. 11). By forming the current injection region 121 and the lens 160 into elongated shapes along the first direction A1, it is possible to limit the light confinement region by the current injection region 121 in the second direction A2 while expanding the light confinement region by the current injection region 121 in the first direction A1. As a result, the width of the laser light E emitted from the laser device the first direction A1 increases, and it is possible to reduce the radiation angle of the laser light E along the Y direction.

Further, the lens 160 causes light resonance not only in the stacking direction (Z direction) but also in the first direction A1 (Y direction). As a result, it is possible to improve the coherence of the laser light E. As described above, since the current injection region 121 and the lens 160 have elongated shapes along the first direction A1, the laser device 100 is capable of emitting the laser light E having a large beam diameter and a narrow radiation angle and operates as a line light source that emits a linear beam.

[Effects of Laser Device]

Figure 14:
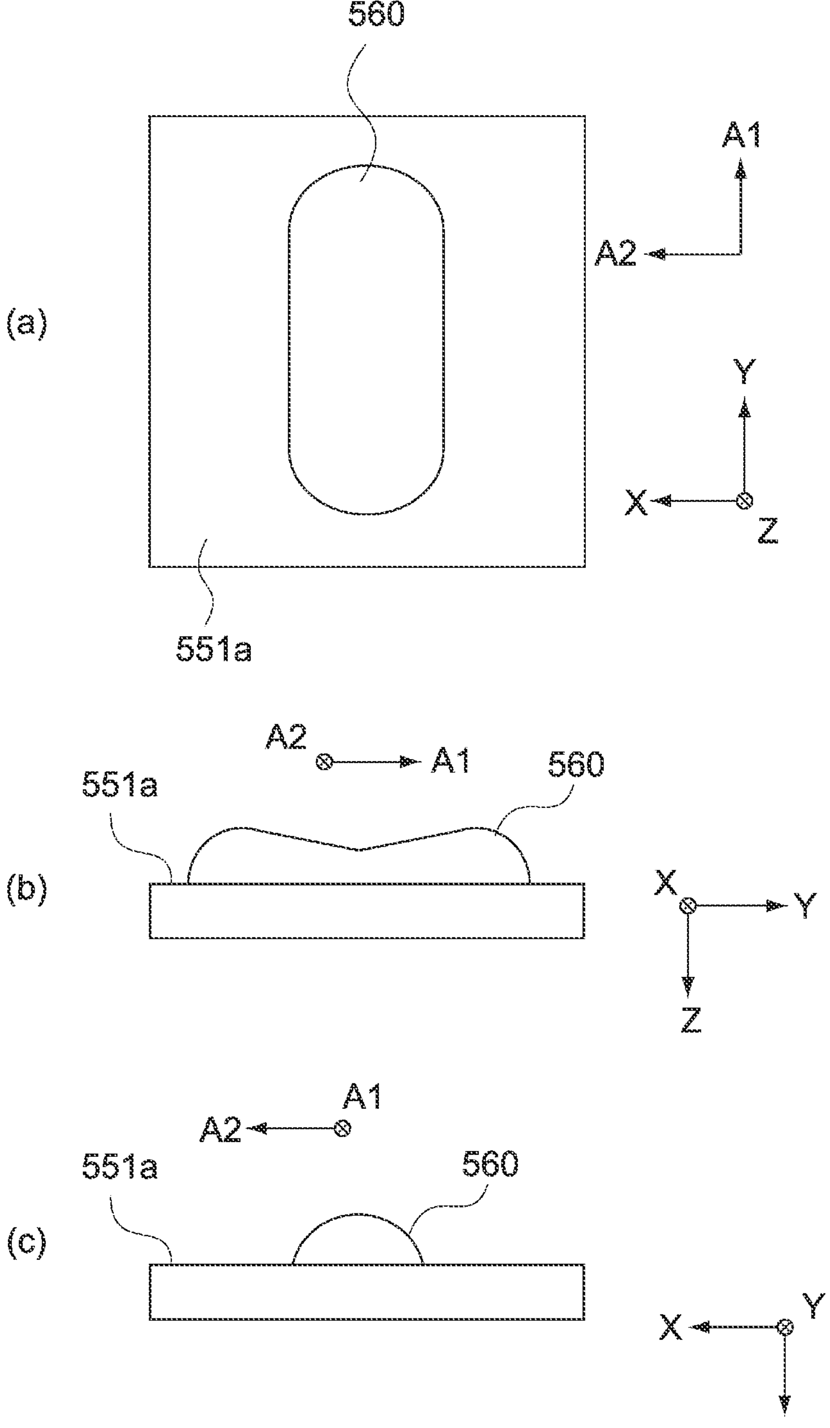
FIG. 14 is a schematic diagram showing a shape of a lens for comparison.

As described above, the laser device 100 includes the lens 160 in which the height $H_s$ from the main surface 151*a* is uniform and the radius of curvature $R_s$ of an apex of the lens in the second direction A2 is uniform. FIG. 14 is a schematic diagram of a lens 560 when viewed from the respective directions, which is shown for comparison. The lens 560 has an elongated lens shape with the first direction A1 as the longitudinal direction and the second direction A2 as the lateral direction. The lens 560 has a shape in which the height thereof from a plane 551*a* is non-uniform and the height of a central portion is low. Further, in the lens 560, the radius of curvature of an apex of the lens in the second direction A2 is also non-uniform.

In the case where a lens has a shape that is long in one direction (particularly 40 μm or more), the central portion is depressed as shown in FIG. 14 due to the influence of surface tension and gravity in the production process, which results in a shape in which the height from the plane 551*a* and the radius of curvature of an apex of the lens is non-uniform. If the laser device 100 includes the lens 560 instead of the lens 160, since the height of the lens 560 is non-uniform, particularly, an end portion is higher than a central portion, the resonator length K (see FIG. 10) differs depending on which portion of the lens 560 the light reaches. For this reason, different longitudinal modes (repeated states in the Z direction) are established at different positions in the laser device 100.

Further, since the radius of curvature of an apex of the lens is non-uniform in the lens 560, different transverse modes (repeated states in the X-Y direction) are established in the laser device 100. Due to these causes, in the case where the laser device 100 includes the lens 560, uneven luminance of the laser light E occurs in the laser device 100, the optical field in the laser device 100 does not become coherent, and the laser light E having a narrow radiation angle cannot be emitted.

On the other hand, the laser device 100 includes the lens 160 in which the height $H_s$ and the radius of curvature $R_s$ of an apex of the lens are uniform. For this reason, by forming the current injection region 121 on the lens 160, it is possible to form a mode having both resonance in the optical axis direction (Z direction) and resonance in the longitudinal direction (Y direction) of the lens 160 and realize the laser device 100 that emits light with high linearity. Further, in the laser device 100, the transverse mode can be unified because the radius of curvature $R_s$ is uniform, and the longitudinal mode can be unified because the height $H_s$ is uniform, in some cases. As a result, the laser light E without uneven luminance can be emitted, and therefore, the laser device 100 is capable of realizing a favorable line light source.

In addition, in a shape in which the height is non-uniform, particularly, an end portion is higher than a central portion, as in the lens 560, since a stress concentrates in the central portion, there is a possibility that it is damaged by heating or physical contact. On the other hand, in the case where the height is uniform as in the lens 160, since a stress is dispersed, it is possible to improve the durability.

[Method of Producing Laser Device]

Figure 15:
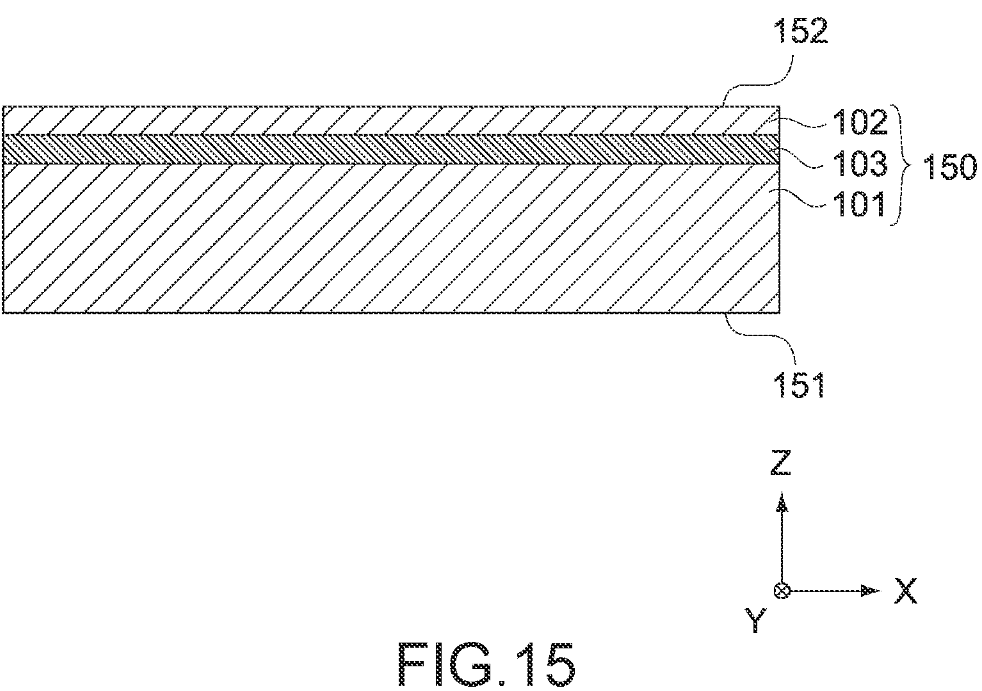
FIG. 15 is a schematic diagram showing a method of producing the laser device according to the first embodiment of the present technology.

A method of producing the laser device 100 will be described. FIG. 15 to FIG. 21 are each a schematic diagram showing a method of producing the laser device 100. First, as shown in FIG. 15, the stacked body 150 is prepared. The stacked body 150 can be prepared by stacking the active layer 103 and the second semiconductor layer 102 on the first semiconductor layer 101 (substrate). The active layer 103 and the second semiconductor layer 102 can be stacked by a metal organic-chemical vapor deposition (MOCVD) method or the like.

Figure 16:
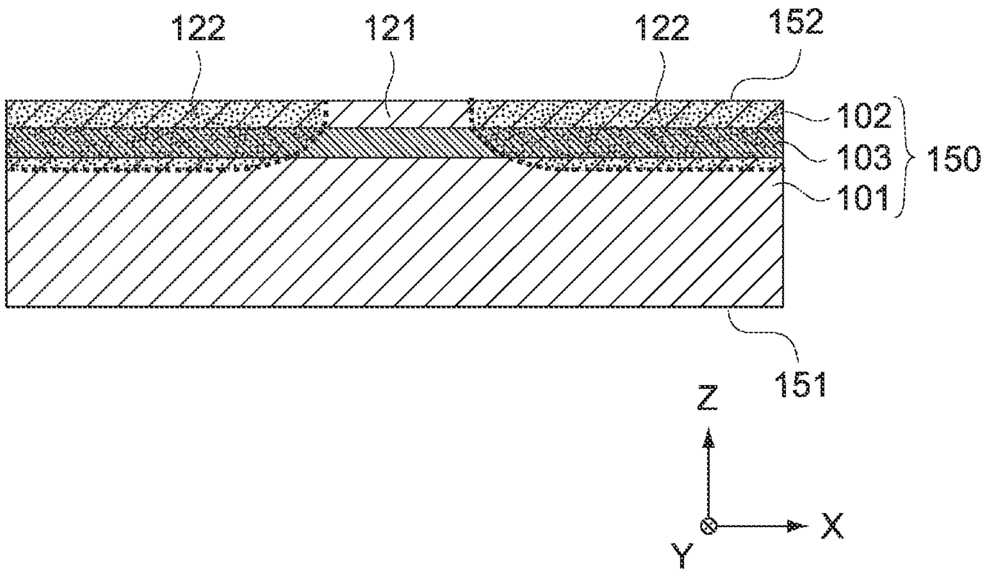
FIG. 16 is a schematic diagram showing the method of producing the laser device.

Subsequently, as shown in FIG. 16, the insulation region 122 is formed. The insulation region 122 can be formed by implanting ions into the stacked body 150 from the side of the second semiconductor layer 102. At this time, by covering a partial region of the second semiconductor layer 102 with a mask, the current injection region 121 that is a region in which ions are not implanted can be formed.

Figure 17:
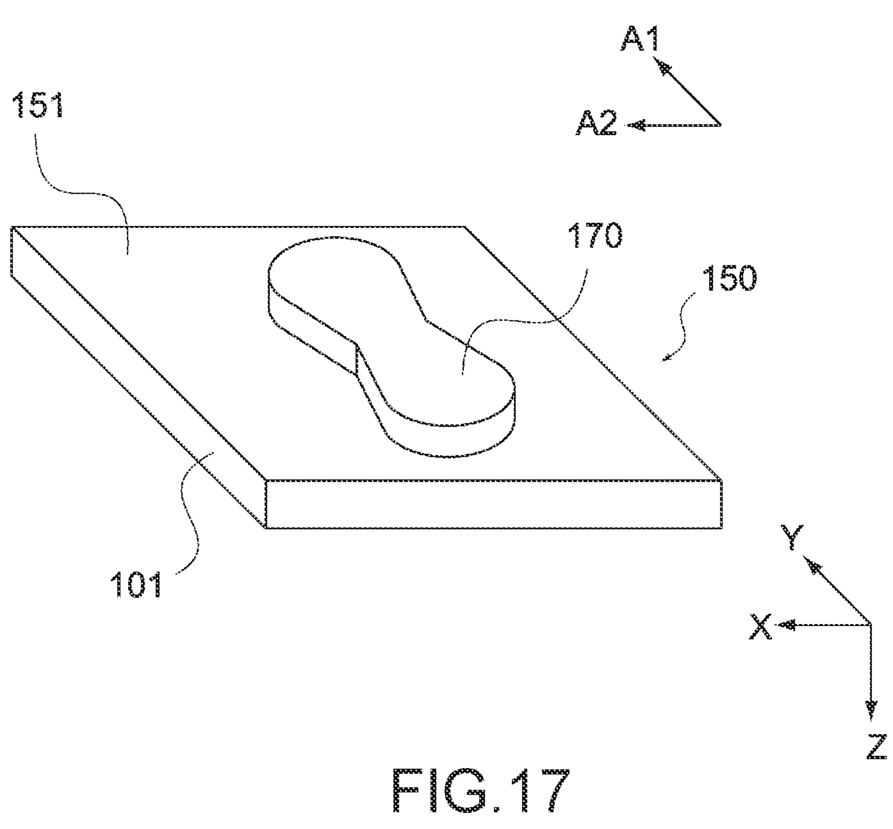
FIG. 17 is a perspective view of a structure in the method of producing the laser device.
Figure 18:
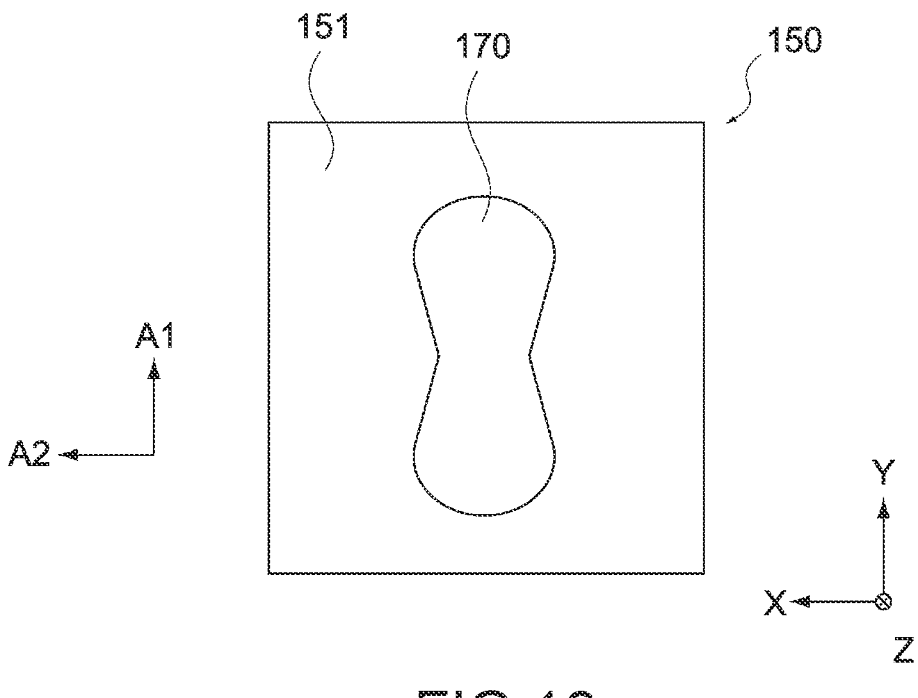
FIG. 18 is a plan view of the structure in the method of producing the laser device.

Subsequently, as shown in FIG. 17, a structure 170 is formed on the first surface 151 of the stacked body 150. The structure 170 has a certain thickness from the first surface 151 and is patterned into a predetermined shape. FIG. 18 is a plan view showing the shape of the structure 170 and is a diagram of the structure 170 when viewed from the optical axis direction (Z direction). As shown in the figure, the structure 170 has an elongated shape with one direction (Y direction) as the longitudinal direction and the direction (X direction) orthogonal to the longitudinal direction as the lateral direction. The longitudinal direction (Y direction) of the structure 170 matches the first direction A1 that is the longitudinal direction of the current injection region 121 (see FIG. 3), and the lateral direction (X direction) of the structure 170 matches the second direction A2 that is the lateral direction of the current injection region 121. That is, the structure 170 has the first direction A1 as the longitudinal direction and the second direction A2 as the lateral direction.

Figures 19, 20:
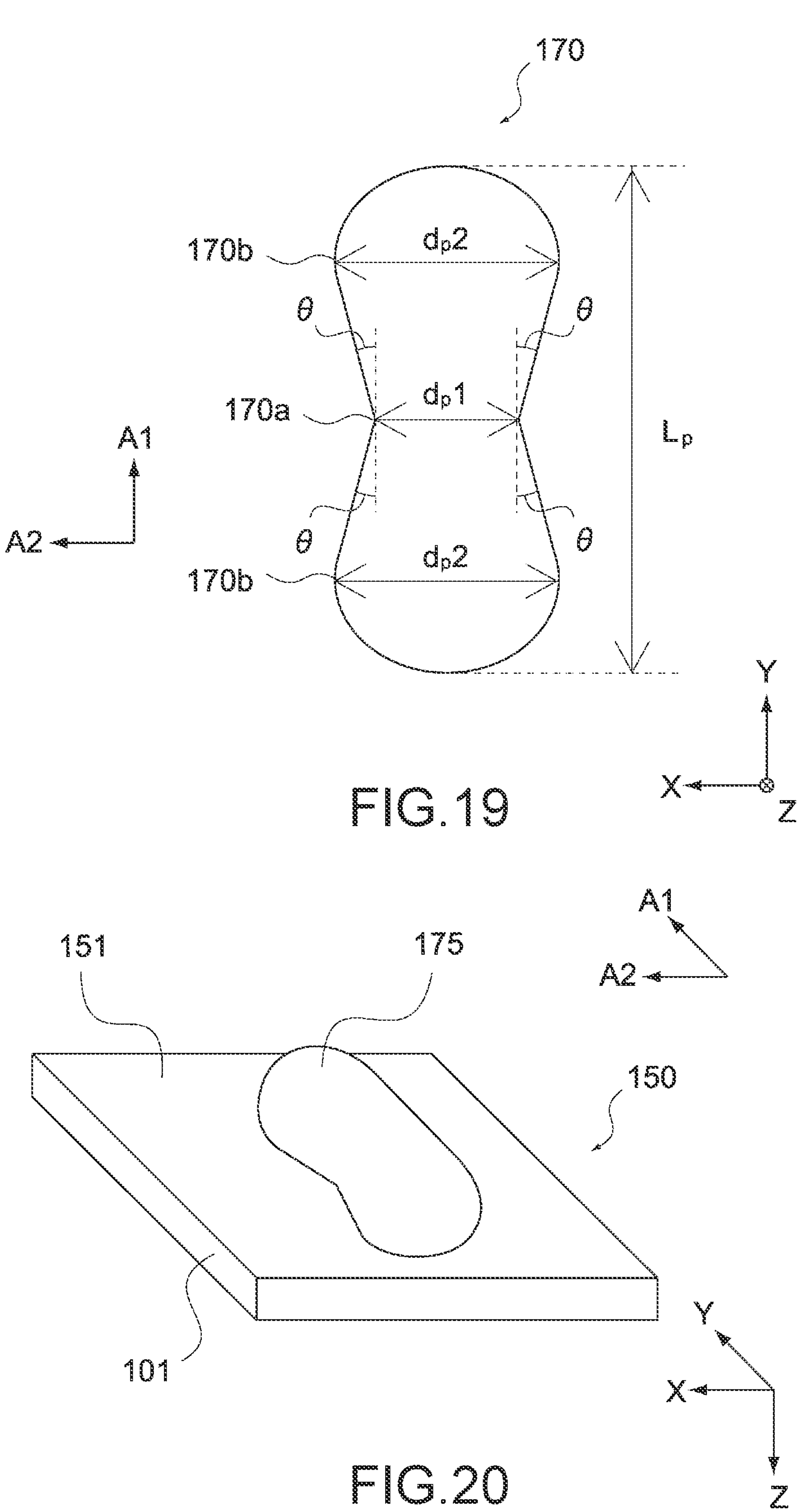
FIG. 19 is a schematic diagram showing a shape of the structure in the method of producing the laser device.
FIG. 20 is a perspective view of the deformed structure in the method of producing the laser device.

FIG. 19 is a schematic diagram showing the shape of the structure 170 when viewed from the optical axis direction (Z direction). As shown in the figure, the structure 170 includes a central portion 170*a* and a non-central portion 170*b*. The central portion 170*a* is a portion of the structure 170 located in the center in the first direction A1. When the width of the central portion 170*a* along the second direction A2 is defined as a first width $d_p$1, the first width $d_p$1 is the shortest width of the structure 170 along the second direction A2. The first width $d_p$1 can be, for example, 36 μm.

Further, the non-central portion 170*b* is a portion of the structure 170 located away from the central portion 170*a* in the first direction A1 and is a portion of the structure 170 near both ends. When the width of the non-central portion 170*b* along the second direction A2 is defined as a second width $d_p$2, the second width $d_p$2 is the largest width of the structure 170 along the second direction A2. The second width $d_p$2 is suitably 10 μm or more, and can be, for example, 40 μm.

In the structure 170, a portion between the central portion 170*a* and the non-central portion 170*b* can have a shape in which the width along the second direction A2 gradually decreases from the non-central portion 170*b* to the central portion 170*a*, as shown in FIG. 19. An angle θ formed between the peripheral edge of the structure 170 and the first direction A1 when viewed from the optical axis direction (Z direction) can be, for example, 3.8°. Further, as shown in FIG. 19, when the length of the structure 170 along the first direction A1 is defined as a length $L_p$, the length $L_p$ is suitably larger than the second width $d_p$2 and is suitably 40 μm or more. The length $L_p$ can be, for example, 100 μm.

The structure 170 is formed of a fluid material having fluidity at room temperature or in a heating process described below. The fluid material can be an organic material or SOG (silicon on glass), and may be a commercially available photoresist. The structure 170 can be formed by applying the fluid material to the first surface 151 to have a certain thickness and patterning the fluid material.

The application of the fluid material can be performed by spin coating, and the rotation speed of the spin coating is 10 rpm or more and can be, for example, 3000 rpm. The patterning can be performed by forming a mask having the above-mentioned plane shape of the structure 170 on the fluid material and performing etching using the mask. The etching may be wet etching or dry etching. Further, reactive ion etching (RIE) may be used. The mask can be formed by photolithography, and an aligner, a stepper, or an electron beam writer can be used as an exposure device. As a light source, g-line, i-line, KrF laser, or ArF laser can be used.

Subsequently, heat treatment (reflow) is performed to heat the structure 170 to a temperature equal to or higher than the melting point of the fluid material. The heating temperature can be, for example, 160°. This heating changes the viscosity of the fluid material and changes the shape of the structure 170. FIG. 20 is a schematic diagram showing a structure 175 that is the structure 170 deformed by the heat treatment. The shape of the structure 175 is the same as the shape of the lens 160 described above. That is, the width of the central portion of the structure 175 is equal to the first width $d_e$1 (see FIG. 8) of the lens 160, and the non-central portion of the structure 175 is equal to the second width $d_s$2 of the lens 160. Further, the height of the structure 175 is uniform and is equal to the height $H_s$ of the lens 160, and the radius of curvature of the apex of the structure 175 in the second direction A2 is equal to the radius of curvature $R_s$ of the apex of the lens 160 in the second direction A2.

Figure 21:
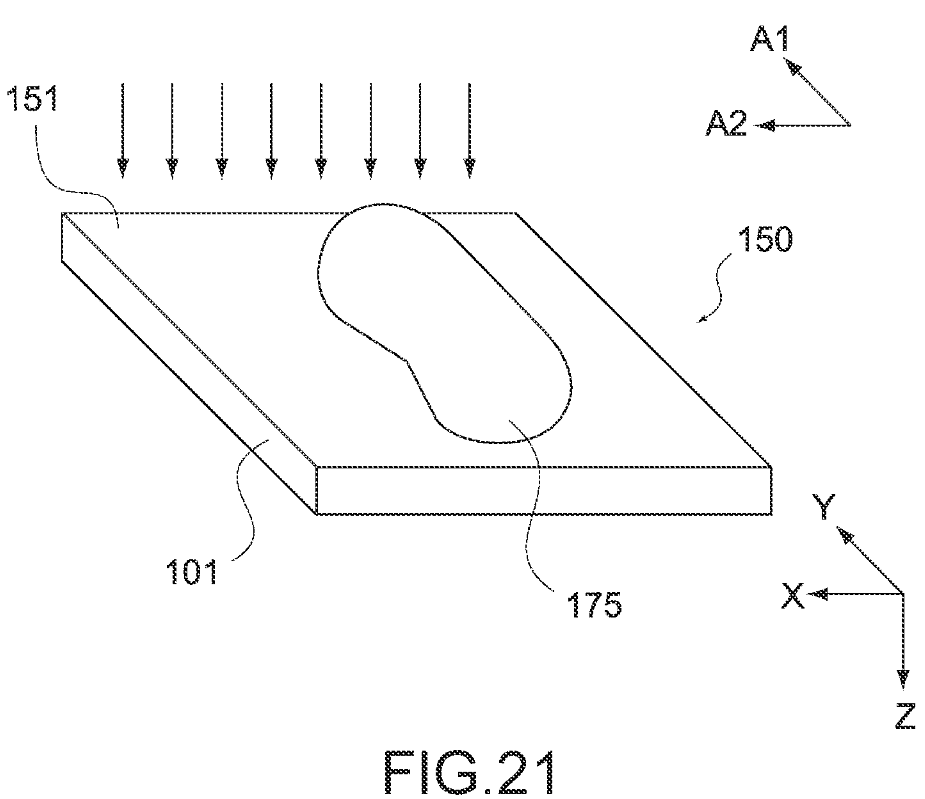
FIG. 21 is a schematic diagram showing an etching process in the method of producing the laser device.

Subsequently, the first semiconductor layer 101 is etched using the structure 175 as an etching mask. FIG. 21 is a schematic diagram showing this etching. As shown by arrows in the figure, an etchant is supplied to the first semiconductor layer 101 from the side of the first surface 151. As a result, the first semiconductor layer 101 is etched from the side of the first surface 151 to form the lens 160. At this time, equalizing the etching rates of the first semiconductor layer 101 and the structure 175, the lens 160 having the same shape as that of the structure 175 can be formed. The etching may be wet etching or dry etching. However, anisotropic etching is suitable, and reactive ion etching may be used.

Further, instead of using the structure 175 as an etching mask, the structure 175 may be used as the lens 160. When the structure 175 is used as the lens 160, the lens 160 that includes a member different from the first semiconductor layer 101 is formed as shown in FIG. 12. By forming the structure 170 of a material having transparency to the light of the oscillation wavelength λ, the structure 175 can be used as the lens 160.

In this way, the lens 160 can be formed on the first surface 151 (see FIG. 6). After that, the first light-reflecting layer 104, the second light-reflecting layer 105, the first electrode 106, and the second electrode 107 are formed, and thus, the laser device 100 shown in FIG. 1 can be prepared. Each of these layers can be formed by a sputtering method, a vacuum deposition method, or the like. When stacking the first light-reflecting layer 104 on the first semiconductor layer 101, since the lens 160 is provided on the first surface 151, the concave mirror 104*c* is formed. Note that the second light-reflecting layer 105 and the second electrode 107 can be formed before forming the lens 160.

In this production method, by making the structure 170 have a shape in which the width of the central portion 170*a* is narrow (see FIG. 19) as described above, it is possible to make the height of the structure 175 and the radius of curvature of the apex uniform, and thus make the height of the lens 160 and the radius of curvature of the apex of the lens uniform. If the structure 170 has a uniform width when viewed from the Z direction, the deformation into the structure 175 results in a shape in which the central portion is depressed (see FIG. 14) due to the influence of the surface tension and the weight, and the radius of curvature of the central portion increases. On the other hand, when the structure 170 has a shape in which the width of the central portion 170*a* is narrow, surface tension acts to reduce the radius of curvature, and it is possible to make the height of the structure 175 and the radius of curvature of the apex uniform.

Further, in the step of etching the first semiconductor layer 101 described above, by performing etching under the condition that the surface accuracy (RMS: Root Mean Square) of the structure 175 is lower than the surface accuracy (RMS) of the first semiconductor layer 101, the surface accuracy (RMS) of the surface of the lens 160 after the etching can be made lower than that before the etching. As a result, it is possible to suppress scattering loss on the surface of the lens 160 and improve the performance of the resonator. In addition, it is possible to reduce the threshold value and power consumption of the laser device 100 and improve the output structure, efficiency, and reliability.

The laser device 100 can be produced in this way. Note that the method of producing the laser device 100 is not limited to that shown here, and the laser device 100 can be produced by another production method.

Figure 22:
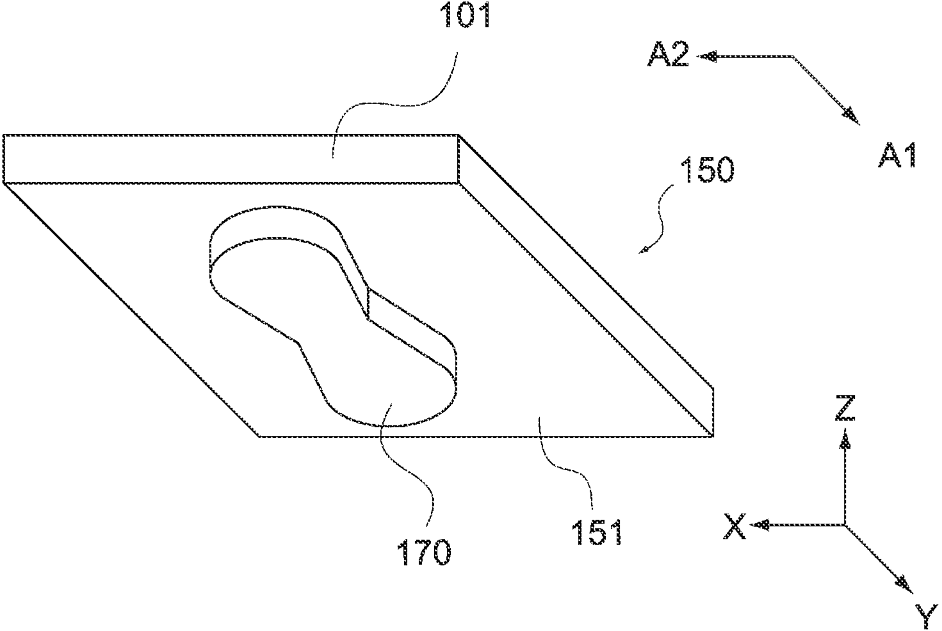
FIG. 22 is a perspective view of the structure in the method of producing the laser device.

FIG. 22 is a schematic diagram showing another method of producing the laser device 100. After forming the structure 170 (see FIG. 17) on the first surface 151, heat treatment (reflow) is performed with the first surface 151 facing vertically downward as shown in the figure. This prevents the height of the central portion of the structure 175 from decreasing due to gravity, and therefore, it is possible to make the height of the structure 175 uniform or make the central portion higher than the end portion.

[Another Configuration of Lens]

Figure 23:
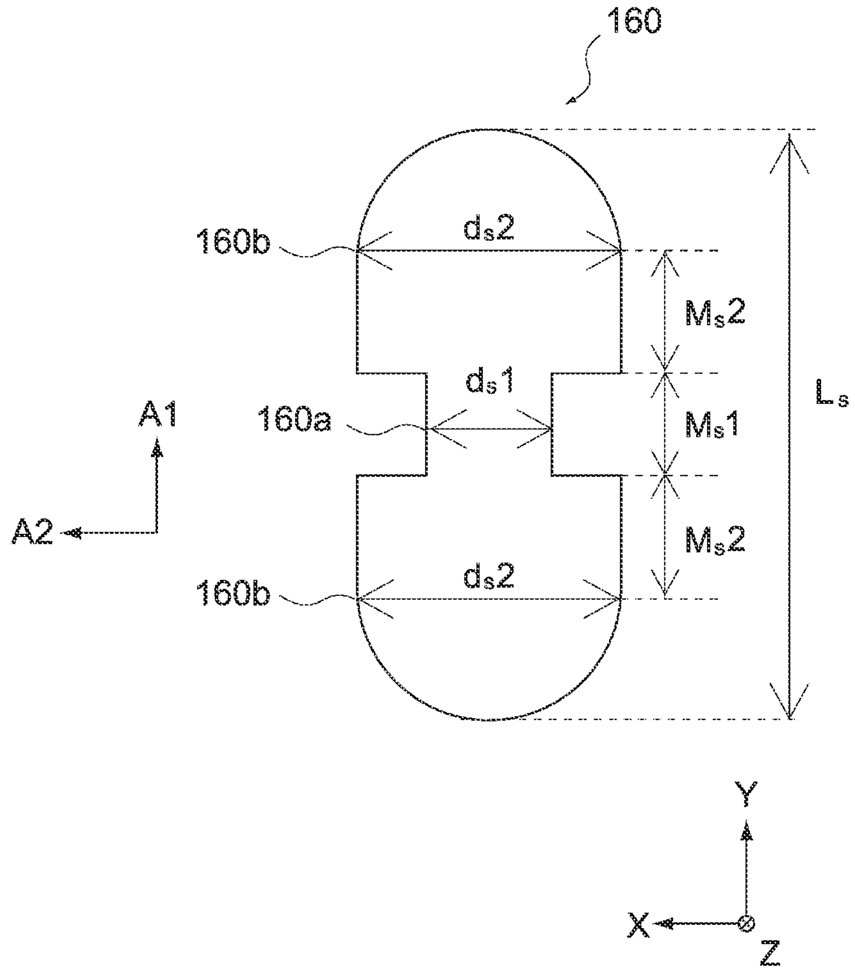
FIG. 23 is a plan view of a lens having another shape included in the laser device.
Figure 25:
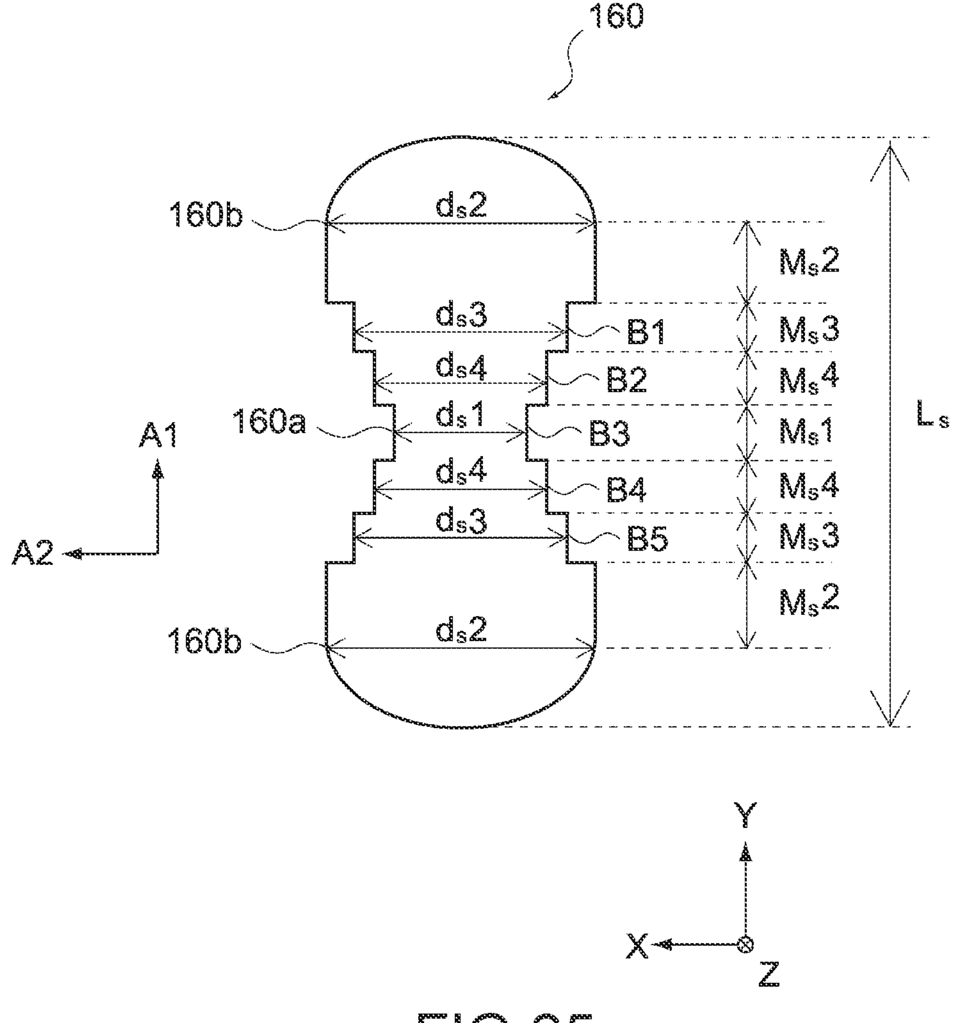
FIG. 25 is a plan view of a lens having another shape included in the laser device.

The lens 160 included in the laser device 100 may have a configuration shown below instead of the configuration described above. FIG. 23 and FIG. 25 are each a plan view of the lens 160 having another configuration and are each a diagram of the lens 160 when viewed from the optical axis direction (Z direction).

As shown in FIG. 23, the lens 160 can have a shape in which the width along the second direction A2 decreases from the non-central portion 160*b* to the central portion 160*a* in a stepwise manner. The height $H_s$ of the lens 160 and the radius of curvature $R_s$ (see FIG. 9) of the apex of the lens in the second direction A2 are uniform. The height $H_s$ can be, for example, 3.6 μm, and the radius of curvature $R_s$ is greater than the resonator length K (see FIG. 10) and can be, for example, 44 μm.

The first width $d_s$1 of the central portion 160*a* along the second direction A2 can be, for example, 36 μm, and the second width $d_s$2 of the non-central portion 160*b* along the second direction A2 can be, for example, 40 μm. Further, the length Ls of the lens 160 along the first direction A1 can be, for example, 100 μm, a length $M_s$1 of a portion having the first width $d_s$1 along the first direction A1 can be, for example, 10 μm, and a length $M_s$2 of a portion having the second width $d_s$2 along the first direction A1 can be, for example, 30 μm.

Figure 24:
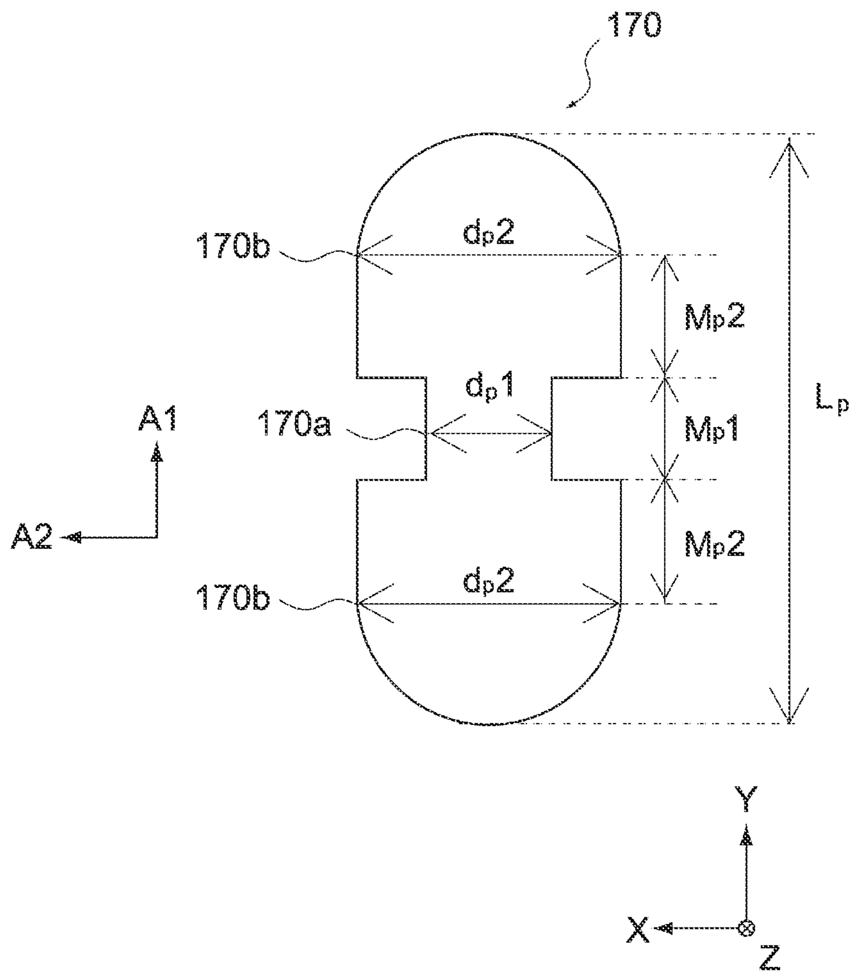
FIG. 24 is a perspective view of the structure used in the process of forming a lens shown in FIG. 23.

The shape of the lens 160 shown in FIG. 23 can be prepared using the following structure 170. FIG. 24 is a plan view of the structure 170 capable of forming this shape of the lens 160. The structure 170 has a certain thickness from the first surface 151 (see FIG. 17), and can have a shape in which the width along the second direction A2 decreases from the non-central portion 160*b* to the central portion 160*a* in a stepwise manner as shown in the figure.

The first width $d_p$1 of the central portion 170*a* along the second direction A2 can be, for example, 36 μm, and the second width $d_p$2 of the non-central portion 170*b* along the second direction A2 can be, for example, 40 μm. Further, the length $L_p$ of the structure 170 along the first direction A1 can be, for example, 100 μm, a length $M_p$1 of a portion having the first width $d_p$1 along the first direction A1 can be, for example, 10 μm, and a length $M_p$2 of a portion having the second width $d_p$2 along the first direction A1 can be, for example, 30 μm.

Further, as shown in FIG. 25, the lens 160 can also have a shape in which rectangular blocks (B1 to B5) whose widths narrow from the non-central portion 160*b* to the central portion 160*a* are connected. The number of blocks is not particularly limited, and can be, for example, five. The height $H_s$ of the lens 160 and the radius of curvature $R_s$ (see FIG. 9) of the apex of the lens in the second direction A2 are uniform. The height $H_s$ can be, for example, 3.6 μm, and the radius of curvature $R_s$ is greater than the resonator length K (see FIG. 10) and can be, for example, 44 μm.

The first width $d_s$1 of the central portion 160*a* along the second direction A2 can be, for example, 36 μm, and the second width $d_s$2 of the non-central portion 160*b* along the second direction A2 can be, for example, 40 μm. In a portion between the central portion 160*a* and the non-central portion 160*b*, the width along the second direction A2 decreases from the non-central portion 160*b* to the central portion 160*a*, and a relationship of the second width $d_s$2> a third width $d_s$3> a fourth width $d_s$4> the first width $d_s$1 is satisfied.

Specifically, for example, the second width $d_s$2 can be 40 μm, the third width $d_s$3 can be 39 μm, the fourth width $d_s$4 can be 38 μm, and the first width $d_s$1 can be 36 μm. Further, the length Ls of the lens 160 along the first direction A1 can be, for example, 100 μm. Regarding the lengths $M_s$1 to $M_s$4 of the respective portions along the first direction A1, the length $M_s$2 can be 10 μm, the length $M_s$3 can be 10 μm, the length $M_s$4 can be 5 μm, and the length $M_s$1 can be 10 μm.

Figure 26:
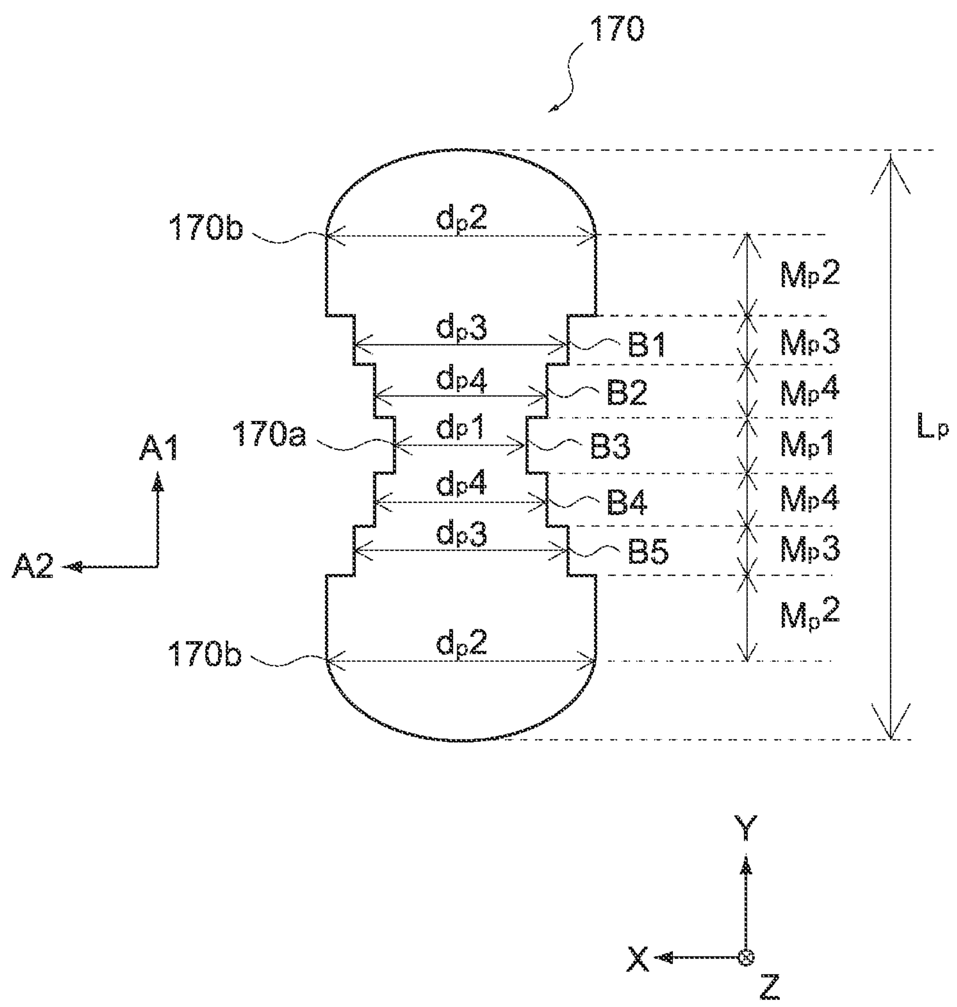
FIG. 26 is a perspective view of the structure used in the process of forming a lens shown in FIG. 25.

The shape of the lens 160 shown in FIG. 25 can be prepared using the following structure 170. FIG. 26 is a plan view of the structure 170 capable of forming this shape of the lens 160. The structure 170 has a certain thickness from the first surface 151 (see FIG. 17), and can have a shape in which rectangular blocks (B1 to B5) whose widths narrow from the non-central portion 160*b* to the central portion 160*a* are connected, as shown in the figure. The first width $d_p$1 of the central portion 170*a* along the second direction A2 can be, for example, 36 μm, and the second width $d_p$2 of the non-central portion 170*b* along the second direction A2 can be, for example, 40 μm.

In a portion between the central portion 170*a* and the non-central portion 170*b*, the width along the second direction A2 decreases from the non-central portion 170*b* to the central portion 170*a*, and a relationship of the second width $d_p$2> a third width $d_p$3> a fourth width $d_p$4> the first width $d_p$1 is satisfied. Specifically, for example, the second width $d_p$2 can be 40 μm, the third width $d_p$3 can be 39 μm, the fourth width $d_p$4 can be 38 μm, and the first width $d_p$1 can be 36 μm. Further, the length $L_p$ of the lens 160 along the first direction A1 can be, for example, 100 μm. Regarding the lengths $M_p$1 to $M_p$4 of the respective portions along the first direction A1, the length $M_p$2 can be 10 μm, the length $M_p$3 can be 10 μm, the length $M_p$4 can be 5 μm, and the length $M_p$1 can be 10 μm.

Also in the case where the lens 160 has the configuration as shown in FIG. 23 and FIG. 25, since the height $H_s$ and the radius of curvature $R_s$ of the apex of the lens are uniform, it is possible to realize a favorable line light source that emits the laser light E without uneven luminance. Further, the shape of the lens 160 can be a shape that includes the central portion 160*a* and the non-central portion 160*b*, in which the height $H_s$ and the radius of curvature $R_s$ of the apex of the lens are uniform, instead of the shape shown here.

[Another Configuration of Laser Device]

Figure 27:
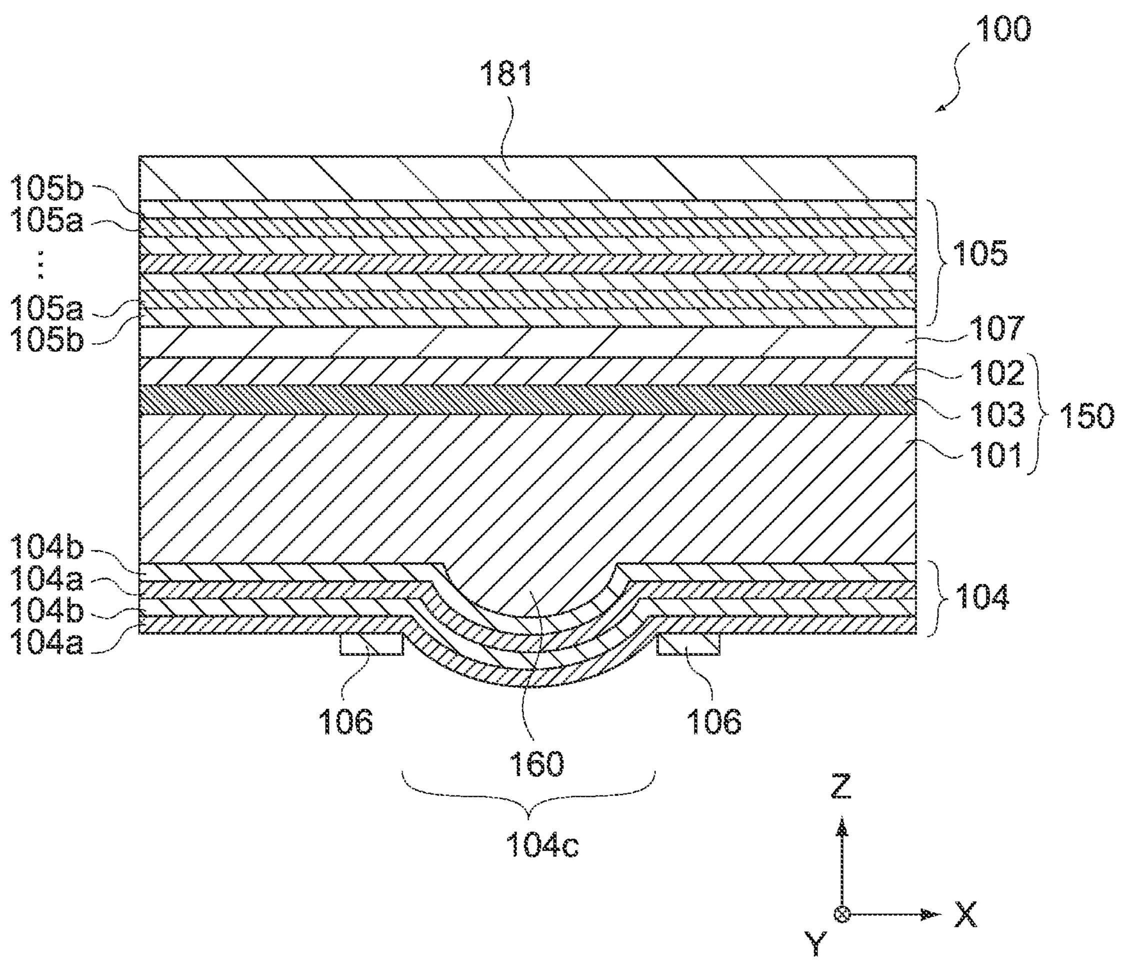
FIG. 27 is a cross-sectional view of a laser device that includes a wavelength conversion layer according to the first embodiment of the present technology.

The configuration of the laser device 100 is not limited to the one described above and may be one including a wavelength conversion layer. FIG. 27 is a cross-sectional view of the laser device 100 that includes a wavelength conversion layer 181. The wavelength conversion layer 181 is formed of a wavelength conversion material, is provided on the side of the second light-reflecting layer 105 opposite to the stacked body 150, and converts the wavelength of the laser light E (see FIG. 13) that has entered from the second light-reflecting layer 105.

The wavelength conversion material forming the wavelength conversion layer 181 can be a wavelength conversion material that is excited by blue light and emits red light. Specifically, red-emitting phosphor particles, more specifically, (ME:Eu)S [however, "ME" means at least one type of atom selected from the group consisting of Ca, Sr, and Ba, and the same applies hereinafter], $(M{:}Sm)x(Si,Al)_{12}(O,N)_{16}$ [however, "M" means at least one type of atom selected from the group consisting of Li, Mg, and Ca, and the same applies hereinafter], $ME_2Si_5N_8{:}Eu$, $(Ca{:}Eu)SiN_2$, and $(Ca{:}Eu)AlSiN_3$ can be used.

Further, the wavelength conversion material forming the wavelength conversion layer 181 can be a wavelength conversion material that is excited by blue light and emits green light. Specifically, green-emitting phosphor particles, more specifically, $(ME{:}Eu)Ga_2S_4$, $(M{:}RE)_X(Si,Al)_{12}(O,N)_{16}$ [however, "RE" means Tb and Yb], $(M{:}Tb)_X(Si,Al)_{12}(O,N)_{16}$, $(M{:}Yb)_X(Si,Al)_{12}(O,N)_{16}$, and $Si_{6-Z}Al_ZO_ZN_{8-Z}{:}Eu$ can be used.

Further, the wavelength conversion material forming the wavelength conversion layer 181 can be a wavelength conversion material that is excited by blue light and emits yellow light. Specifically, yellow-emitting phosphor particles, more specifically, YAG (yttrium-aluminum-garnet) phosphor particles, can be used. Note that the wavelength conversion material may be of one type or two or more types may be mixed and used.

Further, by using a mixture of two or more types of wavelength conversion materials forming the wavelength conversion layer 181, emitted light of a color other than yellow, green, and red may be emitted from the mixture of wavelength conversion materials. Specifically, for example, cyan light may be emitted. In this case, a mixture of green-emitting phosphor particles (e.g., $LaPO_4{:}Ce,Tb$, $BaMgAl_{10}O_{17}{:}Eu,Mn$, $Zn_2SiO_4{:}Mn$, $MgAl_{11}O_{19}{:}Ce,Tb$, $Y_2SiO_5{:}Ce,Tb$, or $MgAl_{11}O_{19}{:}CE,Tb,Mn$) and blue-emitting phosphor particles (e.g., $BaMgAl_{10}O_{17}{:}Eu$, $BaMg_2Al_{16}O_{27}{:}Eu$, $Sr_2P_2O_7{:}Eu$, $Sr_5(PO_4)_3Cl{:}Eu$, $(Sr, Ca, Ba, Mg)_5(PO_4)_3Cl{:}Eu$, $CaWO_4$, or $CaWO_4{:}Pb$) only need to be used.

Further, the wavelength conversion material forming the wavelength conversion layer 181 can be a wavelength conversion material that is excited by ultraviolet rays and emits red light. Specifically, red-emitting phosphor particles, more specifically, $Y_2O_3{:}Eu$, $YVO_4{:}Eu$, $Y(P,V)O_4{:}Eu$, $3.5MgO{\cdot}0.5MgF_2{\cdot}Ge_2{:}Mn$, $CaSiO_3{:}Pb$, Mn, $Mg_6AsO_{11}{:}Mn$, $(Sr, Mg)_3(PO_4)_3{:}Sn$, $La_2O_2S{:}Eu$, or $Y_2O_2S{:}Eu$ can be used.

Further, the wavelength conversion material forming the wavelength conversion layer 181 can be a wavelength conversion material that is excited by ultraviolet rays and emits green light. Specifically, green-emitting phosphor particles, more specifically, $LaPO_4{:}Ce,Tb$, $BaMgAl_{10}O_{17}{:}Eu,Mn$, $Zn_2SiO_4{:}Mn$, $MgAl_{11}O_{19}{:}Ce,Tb$, $Y_2SiO_5{:}Ce,Tb$, $MgAl_{11}O_{19}{:}CE,Tb,Mn$, or $Si_{6-Z}Al_ZO_ZN_{8-Z}{:}Eu$ can be used.

Further, the wavelength conversion material forming the wavelength conversion layer 181 can be a wavelength conversion material that is excited by ultraviolet rays and emits blue light. Specifically, blue-emitting phosphor particles, more specifically, $BaMgAl_{10}O_{17}{:}Eu$, $BaMg_2Al_{16}O_{27}{:}Eu$, $Sr_2P_2O_7{:}Eu$, $Sr_5(PO_4)3Cl{:}Eu$, $(Sr, Ca, Ba, Mg)_5(PO_4)_3Cl{:}Eu$, CaWO4, or $CaWO_4{:}Pb$ can be used.

Further, the wavelength conversion material forming the wavelength conversion layer 181 can be a wavelength conversion material that is excited by ultraviolet rays and emits yellow light. Specifically, yellow-emitting phosphor particles, more specifically, YAG phosphor particles, can be used. Note that the wavelength conversion material may be of one type or two or more types may be mixed and used. Further, by using a mixture of two or more types of wavelength conversion materials, emitted light of a color other than yellow, green, and red may be emitted from the mixture of wavelength conversion materials. Specifically, cyan light may be emitted. In this case, a mixture of the green-emitting phosphor particles and the blue-emitting phosphor particles described above only needs to be used.

However, the wavelength conversion material (color conversion material) is not limited to phosphor particles. Examples of the wavelength conversion material include light-emitting particles in which the wave function of the carriers is localized in order to efficiently convert carriers into light as in the direction transition material in the indirect transition silicon material and the quantum effect is used, a quantum well structure such as a two-dimensional quantum well structure, one-dimensional quantum well structure (quantum wire), and a zero-dimensional quantum well structure (quantum dot) being applied to the light-emitting particles. Further, it is known that rare earth atoms added to a semiconductor material sharply emit light due to intrashell transitions, and light-emitting particles to which such a technology is applied can also be used.

Examples of the wavelength conversion material (color conversion material) forming the wavelength conversion layer 181 include the quantum dot as described above. As the size (diameter) of the quantum dot decreases, the band-gap energy increases and the wavelength of light emitted from the quantum dot decreases. That is, light having a shorter wavelength (light on the blue light side) is emitted as the size of the quantum dot is smaller, and light having a longer wavelength (light on the red light side) is emitted as the size is larger. Therefore, by using the same material forming the quantum dot and adjusting the size of the quantum dot, it is possible to obtain a quantum dot that emits light having a desired wavelength (converts into a desired color).

Specifically, the quantum dot favorably has a core shell structure. Examples of the material forming the quantum dot include, but not limited to, Si; Se; CIGS (CuInGaSe) that is a chalcopyrite compound, CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, $AgInSe_2$; perovskite material; GaAs that is a III-V compound, GaP, InP, InAs, InGaAs, AlGaAs, InGaP, AlGaInP, InGaAsP, GaN; CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, and $TiO_2$.

Further, although the first semiconductor layer 101 is formed of an n-type semiconductor material and the second semiconductor layer 102 is formed of a p-type semiconductor material in the above description, the first semiconductor layer 101 may be formed of a p-type semiconductor material and the second semiconductor layer 102 may be formed of an n-type semiconductor material. In addition, the laser device 100 may have another configuration capable of realizing the operation of the laser device 100 described above.

[Regarding Laser Device Array]

Figure 28:
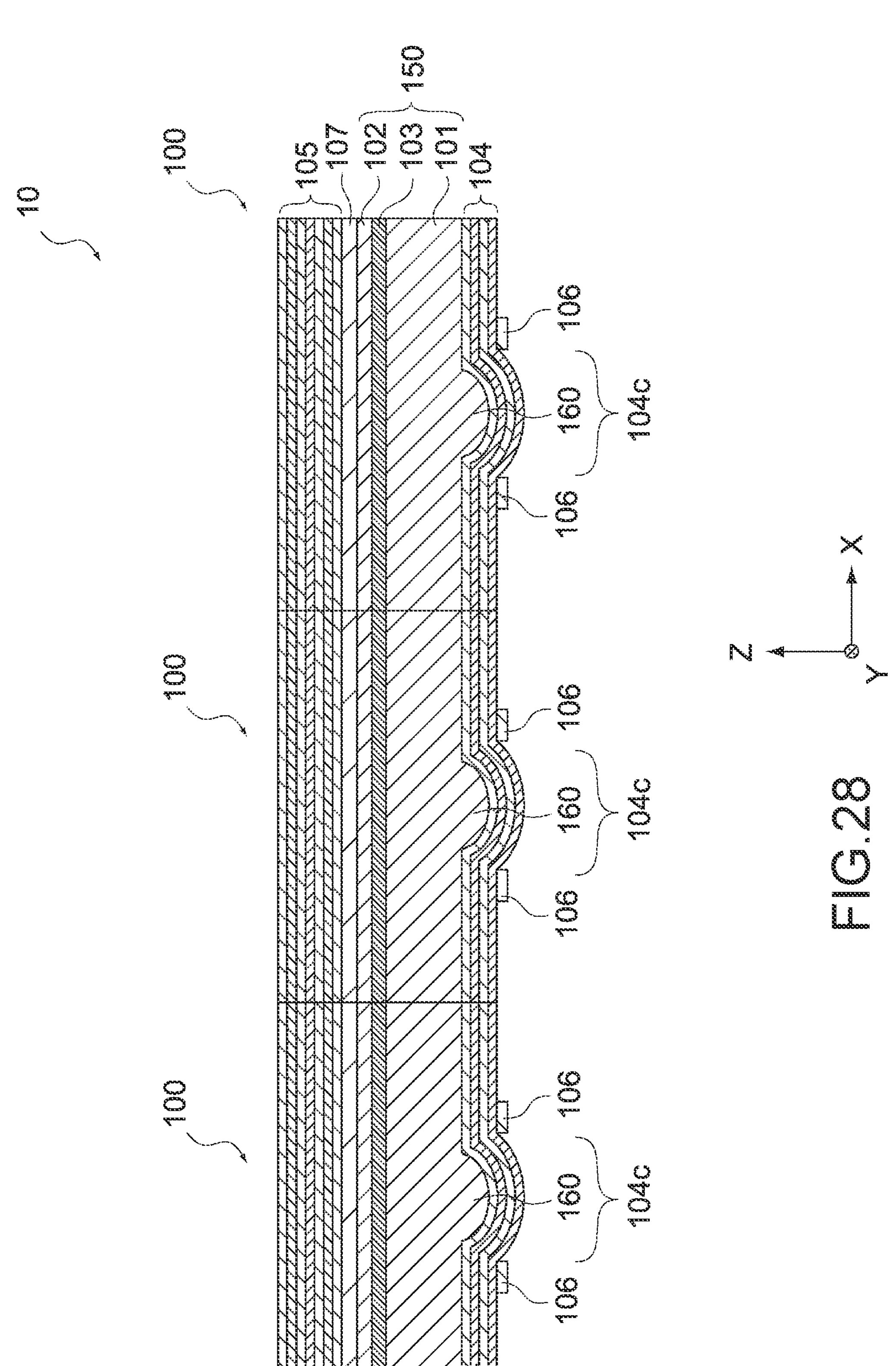
FIG. 28 is a cross-sectional view of a laser device array according to the first embodiment of the present technology.

The laser device 100 can constitute a laser device array. FIG. 28 is a cross-sectional view of a laser device array 10 according to this embodiment, and FIG. 29 is a schematic plan view of the laser device array 10.

Figure 29:
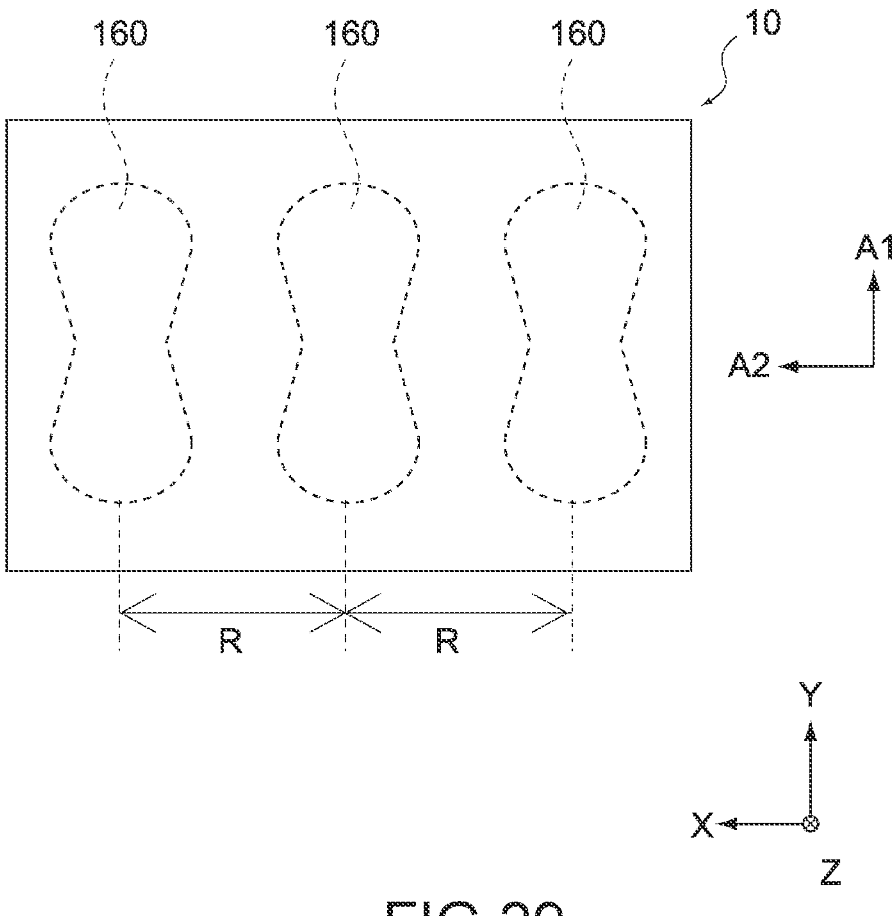
FIG. 29 is a plan view of the laser device array.

As shown in FIG. 28 and FIG. 29, the laser device array 10 includes a plurality of arrayed laser devices 100. The number of laser devices 100 constituting the laser device array 10 is not particularly limited, but can be, for example, 10. As shown in FIG. 29, the laser devices 100 can be arrayed such that the first direction A1 (longitudinal direction of the lens 160) of each of the laser devices 100 matches. An array pitch R (interval between the centers of the lenses 160) can be, for example, 20 μm. The array direction of the laser device 100 is not limited thereto, and the lenses 160 may be arrayed in a hexagonal close-packed array.

The first electrode 106 of each of the laser devices 100 is spaced apart from the first electrode 106 of the adjacent laser device 100. For this reason, by independently controlling the voltage between the first electrode 106 and the second electrode 107 of each of the laser devices 100, it is possible to cause the laser device 100 to independently emit light. Since each of the laser devices 100 is a favorable line light source emitting the laser light E without uneven luminance, the laser device array 10 can have a high output exceeding 1 W, for example, by arraying the laser devices 100.

Figure 30:
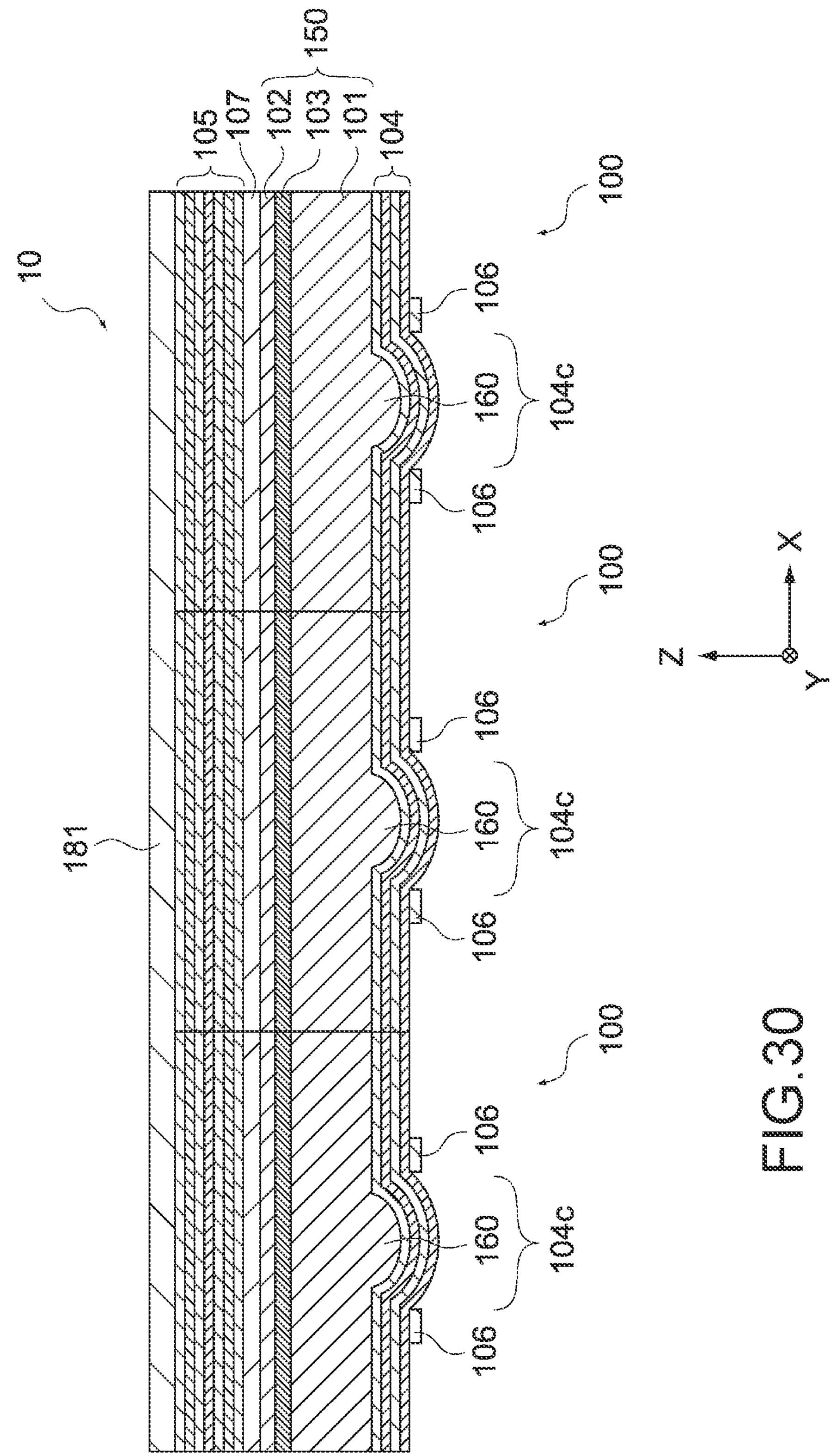
FIG. 30 is a cross-sectional view of a laser device array that includes a wavelength conversion layer according to the first embodiment of the present technology.

Also in the laser device array 10, the laser device 100 can include the wavelength conversion layer 181. FIG. 30 is a cross-sectional view showing the laser device array 10 including the wavelength conversion layer 181. The wavelength conversion layer 181 may be included in each of the laser devices 100 or may be one continuous layer between the plurality of laser devices 100.

Second Embodiment

A laser device according to a second embodiment of the present technology will be described. The laser device according to this embodiment is different from the laser device according to the first embodiment mainly in the current confinement structure. The laser device according to this embodiment has a structure similar to that of a VCSEL device, but the laser device according to this embodiment is different from the VCSEL device in that resonance occurs not only in the Z direction but also in another direction (Y direction).

[Structure of Laser Device]

Figure 31:
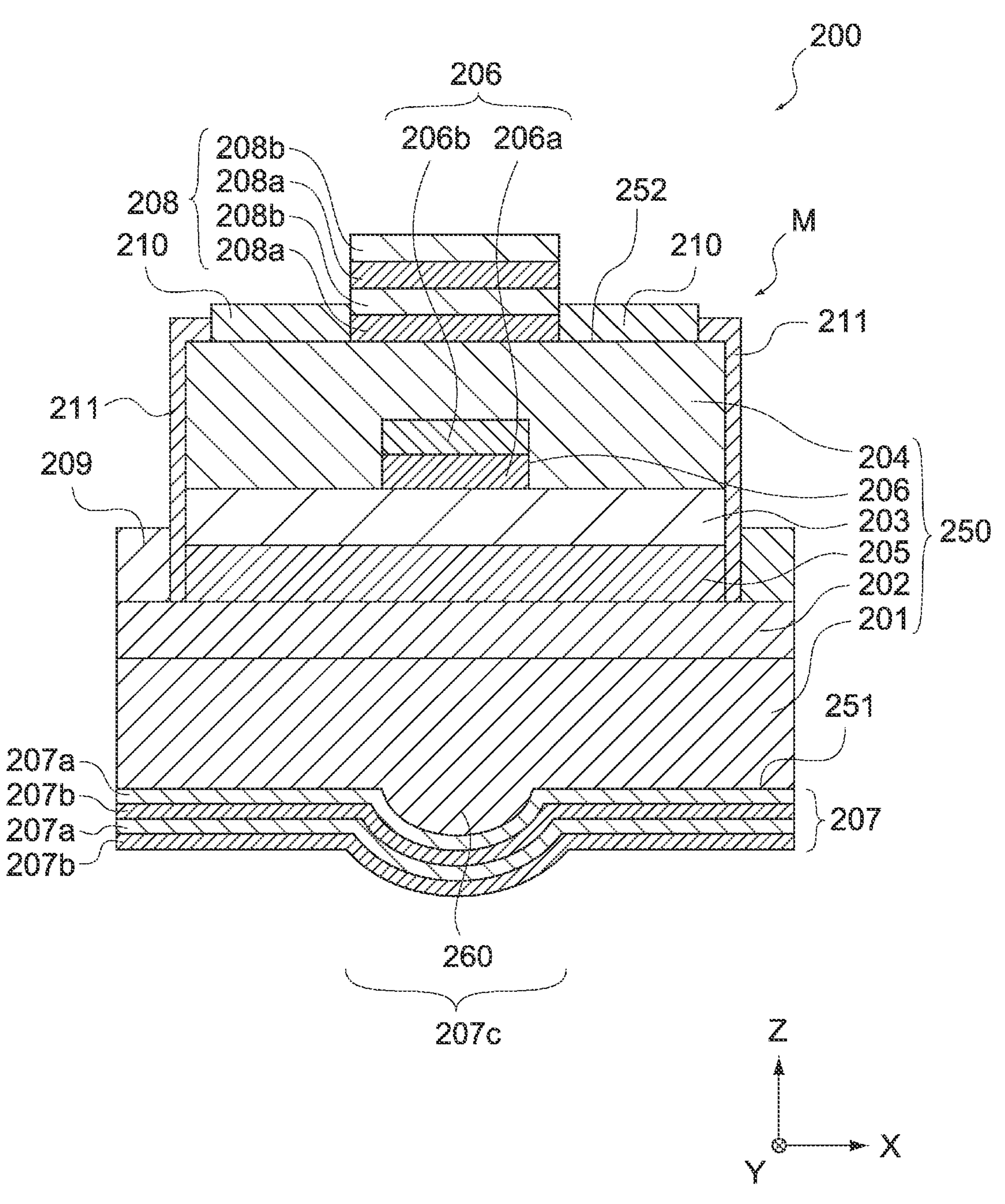
FIG. 31 is a cross-sectional view of a laser device according to a second embodiment of the present technology.
Figure 32:
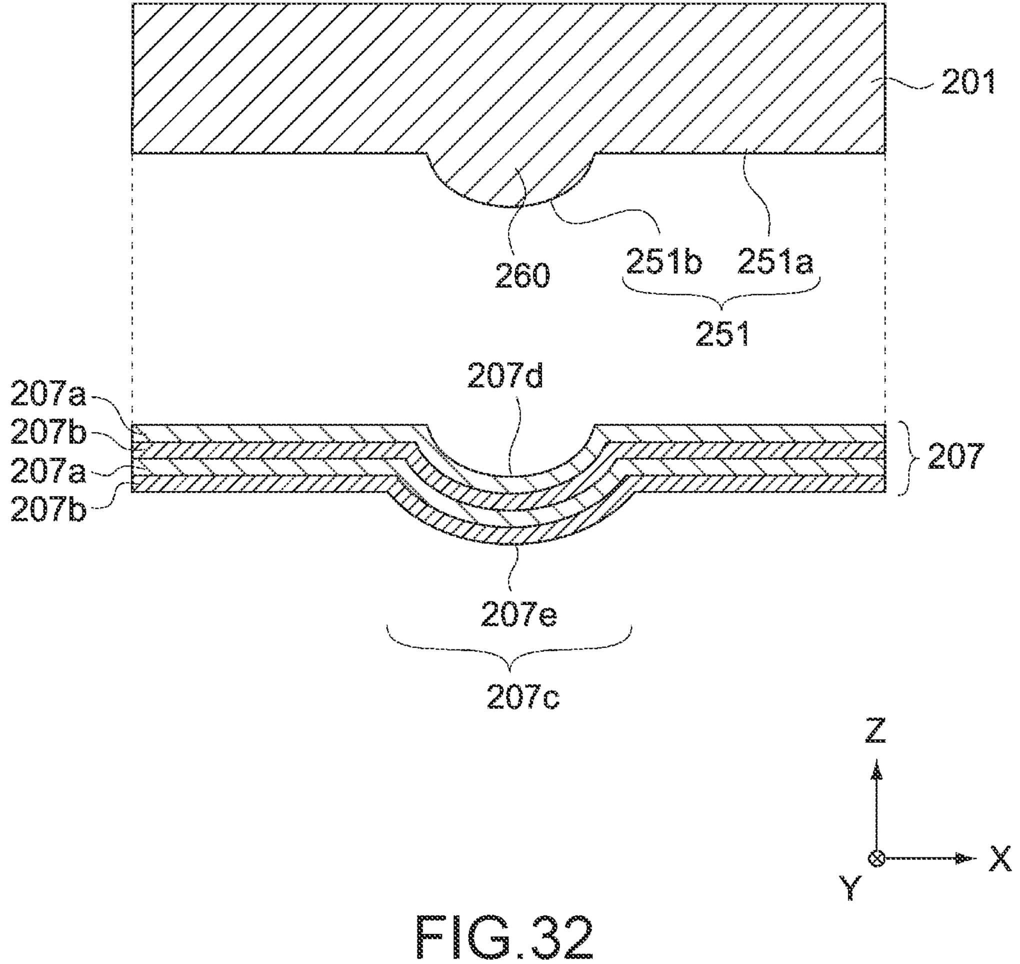
FIG. 32 is an exploded cross-sectional view showing a partial configuration of the laser device.

FIG. 31 is a cross-sectional view of a laser device 200 according to this embodiment, and FIG. 32 is an exploded cross-sectional view showing a partial configuration of the laser device 200. As shown in these figures, the laser device 200 includes a substrate 201, a first semiconductor layer 202, a second semiconductor layer 203, a third semiconductor layer 204, an active layer 205, a tunnel junction layer 206, a first light-reflecting layer 207, a second light-reflecting layer 208, a first electrode 209, a second electrode 210, and an insulation film 211. Of these, the substrate 201, the first semiconductor layer 202, the second semiconductor layer 203, the third semiconductor layer 204, the active layer 205, and the tunnel junction layer 206 are collectively referred to as a stacked body 250.

Each of these layers has a layer surface direction along the X-Y plane, and the first light-reflecting layer 207, the substrate 201, the first semiconductor layer 202, the active layer 205, the second semiconductor layer 203, the third semiconductor layer 204, and the second light-reflecting layer 208 are stacked in this order. Therefore, the stacked body 250 is disposed between the first light-reflecting layer 207 and the second light-reflecting layer 208.

The substrate 201 supports each of the layers of the laser device 200. The substrate 201 can include, for example, a semi-insulating InP substrate. As shown in FIG. 32, a lens 260 is provided on the substrate 201. This lens 260 will be described below.

The first semiconductor layer 202 is a layer that is formed of a semiconductor having a first conductivity type and transports carriers to the active layer 205. The first conductivity type can be an n-type, and the first semiconductor layer 202 can be a layer formed of, for example, n-InP. The second semiconductor layer 203 is a layer that is formed of a semiconductor having a second conductivity type and transports carriers to the active layer 205. The second conductivity type can be a p-type, and the second semiconductor layer 203 can be a layer formed of, for example, p-InP. The third semiconductor layer 204 is a layer that is formed of a semiconductor having a first conductivity type and transports carriers to the tunnel junction layer 206. The third semiconductor layer 204 can be a layer formed of, for example, n-InP.

The active layer 205 is a layer that is disposed between the first semiconductor layer 202 and the second semiconductor layer 203 and emits light by carrier recombination. The active layer 205 has a multiple quantum well structure in which a quantum well layer and a barrier layer are alternately stacked to obtain a plurality of layers, the quantum well layer can be formed of, for example, InGaAsP, and the barrier layer can be formed of, for example, InGaAsP having a composition different from that of the quantum well layer. Further, the active layer 205 only needs to be a layer that emits light by carrier recombination instead of the multiple quantum well structure.

The tunnel junction layer 206 forms a buried tunnel junction. The tunnel junction layer 206 is disposed between the central portion of the second semiconductor layer 203 and the central portion of the third semiconductor layer 204. The tunnel junction layer 206 includes a first layer 206*a* on the side of the second semiconductor layer 203 and a second layer 206*b* on the side of the third semiconductor layer 204. The first layer 206*a* is a layer of the second conductivity type with a high impurity concentration, and can be, for example, a layer formed of $p^+$-AlInGaAs. The second layer 206*b* is a layer of the first conductivity type with a high impurity concentration, and can be, for example, a layer formed of $n^+$-InP.

As shown in FIG. 31, the outer periphery portions of the active layer 205, the second semiconductor layer 203, and the third semiconductor layer 204 are removed to form a mesa (plateau structure) M. The tunnel junction layer 206 is disposed to be located in the central portion of the mesa M when viewed from the Z direction.

As shown in FIG. 31, of surfaces of the stacked body 250, the surface on the side of the first light-reflecting layer 207 is defined as a first surface 251 and the surface on the side of the second light-reflecting layer 208 is defined as a second surface 252. The lens 260 is provided on the first surface 251. As a result, as shown in FIG. 32, the first surface 251 has a main surface 251*a* and a lens surface 251*b*. The main surface 251*a* is a plane (X-Y plane) perpendicular to the optical axis direction (Z direction) of emitted light. The lens surface 251*b* is a surface of the lens 260 and is a surface protruding from the main surface 251*a*.

The first light-reflecting layer 207 reflects light of a specific wavelength (hereinafter, a wavelength λ) and causes light of a wavelength other than that to be transmitted therethrough. The wavelength λ is a specific wavelength within, for example, 1300 to 1600 nm. As shown in FIG. 31, the first light-reflecting layer 207 can be a DBR (Distributed Bragg Reflector) including a multilayer light-reflecting film in which a high-refractive index layer 207*a* and a low-refractive index layer 207*b* having an optical film thickness of λ/4 are alternately stacked to obtain a plurality of layers. For example, the first light-reflecting layer 207 can have a layered structure of $Ta_2O_5/SiO_2$, $SiO_2/SiN$, $SiO_2/Nb_2O_5$, or the like.

The first light-reflecting layer 207 includes a concave mirror 207*c*. The first light-reflecting layer 207 is stacked on a second surface 201*b* of the substrate 201 to have a certain thickness, the surface thereof on the side of the stacked body 250 forms a concave surface 207*d* in accordance with the shape of the lens 260 provided on the first surface 251, and the surface on the side opposite to the stacked body 250 forms a convex surface 207*e*. As a result, the concave mirror 207*c* is formed in the first light-reflecting layer 207.

The second light-reflecting layer 208 reflects light of the wavelength λ and causes light of a wavelength other than that to be transmitted therethrough. As shown in FIG. 31, the second light-reflecting layer 208 can be a DBR (Distributed Bragg Reflector) including a multilayer light-reflecting film in which a high-refractive index layer 208*a* and a low-refractive index layer 208*b* having an optical film thickness of λ/4 are alternately stacked to obtain a plurality of layers. For example, the second light-reflecting layer 208 can have a layered structure of $Ta_2O_5/SiO_2$, $SiO_2/SiN$, $SiO_2/Nb_2O_5$, or the like.

The first electrode 209 is provided around the mesa M on the first semiconductor layer 202 and functions as one electrode of the laser device 200. The first electrode 209 can include, for example, a single-layer metal film formed of Au, Ni, Ti, or the like, or a multiplayer metal film formed of Ti/Au, Ag/Pd, Ni/Au/Pt, or the like.

The second electrode 210 is provided around the second light-reflecting layer 208 on the third semiconductor layer 204 and functions as the other electrode of the laser device 200. The second electrode 210 can include, for example, a single-layer metal film formed of Au, Ni, Ti, or the like, or a multiplayer metal film formed of Ti/Au, Ag/Pd, Ni/Au/Pt, or the like. The insulation film 211 is provided around the second electrode 210 on the side surface of the mesa M and the upper surface of the mesa M to insulate the outer periphery of the mesa M. The insulation film 211 is formed of an arbitrary insulating material.

Figure 33:
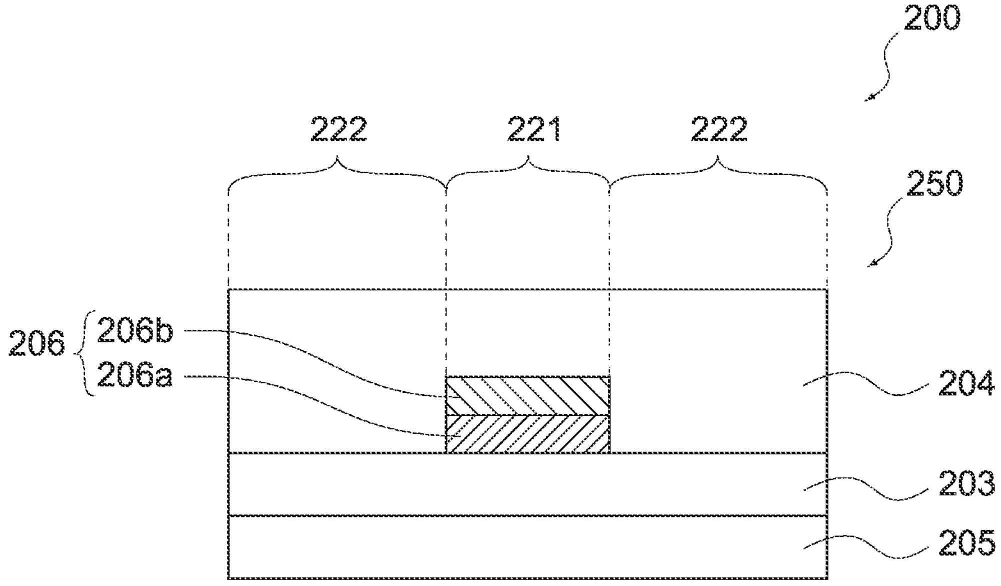
FIG. 33 is a schematic diagram showing a current confinement structure of the laser device.
Figure 33:

In the laser device 200, a current confinement structure is formed in the stacked body 250 by the tunnel junction layer 206. FIG. 33 is a schematic diagram showing the current confinement structure. As shown in the figure, the current confinement structure has a current injection region 221 and an insulation region 222. The current injection region 221 is a region in which a tunnel junction is formed by the tunnel junction layer 206 (tunnel junction region), and causes a current to pass therethrough by the tunnel junction. The insulation region 222 is a region that surrounds the current injection region 221 in the layer surface direction (X-Y direction) and does not cause a current to pass therethrough because no tunnel junction is formed (non-tunnel-junction region). Since a current flowing through the laser device 200 cannot pass through the insulation region 222, the current concentrates in the current injection region 221. That is, a current confinement structure is formed by the current injection region 221 and the insulation region 222.

[Regarding Shapes of Current Injection Region and Lens]

The shape of the current injection region 221 in the laser device 200 is the same as that of the current injection region 121 according to the first embodiment. That is, the current injection region 221 has an elongated plane shape with the first direction A1 as the longitudinal direction and the second direction A2 as the lateral direction (see FIG. 3 and FIG. 4). The first direction A1 and the second direction A2 are orthogonal to the optical axis direction (Z direction) and are directions orthogonal to each other.

Further, also the shape of the lens 260 in the laser device 200 is the same as that of the lens 160 according to the first embodiment. That is, the lens 260 has an elongated lens shape with the first direction A1 as the longitudinal direction and the second direction A2 as the lateral direction. Also the length, width, and height of the lens 260, the radius of curvature of the apex of the lens, and the surface accuracy (RMS) are the same as those in the lens 160.

Note that although the lens 260 may be formed by part of the substrate 201 as shown in FIG. 32, the lens 260 may include a member that is different from the substrate 201 and bonded to the substrate 201 (see FIG. 12).

[Operation of Laser Device]

The laser device 200 operates similarly to the laser device 100 according to the first embodiment. That is, when a voltage is applied between the first electrode 209 and the second electrode 210, a current flows between the first electrode 209 and the second electrode 210. The current is confined by the current confinement structure and injected to the current injection region 221. The spontaneous emission light caused by this injected current is reflected by the first light-reflecting layer 207 and the second light-reflecting layer 208 to cause laser oscillation. The laser light generated thereby is transmitted through the second light-reflecting layer 208 and is emitted from the laser device 200 with the Z direction as the optical axis direction. The laser device 200 is capable of emitting the laser light E having a large beam diameter and a narrow radiation angle by the shapes of the current injection region 221 and the lens 260, and operates as a line light source that emits a linear beam.

[Effects of Laser Device]

Also the laser device 200 includes the lens 260 in which the height $H_s$ from the main surface 251*a* and the radius of curvature $R_s$ (see FIG. 9) of the apex of the lens in the second direction A2 are uniform. For this reason, by forming the current injection region 221 on the lens 260, it is possible to form a mode having both resonance in the optical axis direction (Z direction) and resonance in the longitudinal direction (Y direction) of the lens 260 and realize the laser device 200 that emits light having high linearity. Further, in the laser device 200, the transverse mode can be unified because the radius of curvature $R_s$ is uniform, and the longitudinal mode can be unified because the height $H_s$ is uniform, in some cases. As a result, the laser light E without uneven luminance can be emitted, and therefore, the laser device 200 is capable of realizing a favorable line light source. Further, since the height is more uniform in the lens 260 and a stress is dispersed, it is possible to improve the durability.

[Method of Producing Laser Device]

In the method of producing the laser device 200, after stacking the respective layers up to the second layer 206*b* on the substrate 201 by a metal organic-chemical vapor deposition method or the like, unnecessary portions of the first layer 206$a$ and the second layer 206$b$ are removed by photolithography and etching to form the tunnel junction layer 206. The shape of the tunnel junction layer 206 can be freely controlled by photolithography.

Subsequently, the third semiconductor layer 204 is stacked on the tunnel junction layer 206, and the mesa M is formed by photolithography and etching. As a result, the stacked body 250 is formed on the substrate 201. Further, the lens 260 is provided on the substrate 201 by a method similar to that in the first embodiment, and the first light-reflecting layer 207, the second light-reflecting layer 208, and the like are stacked, thereby making it possible to produce the laser device 200. Further, the laser device 200 can be produced by another production method.

[Regarding Current Confinement Structure by Ion Implantation]

Although a current confinement structure is provided by the buried tunnel junction by the tunnel junction layer 206 in the laser device 200, as described above, a current confinement structure can also be provided by ion implantation into the tunnel junction layer 206 as described below.

Figure 34:
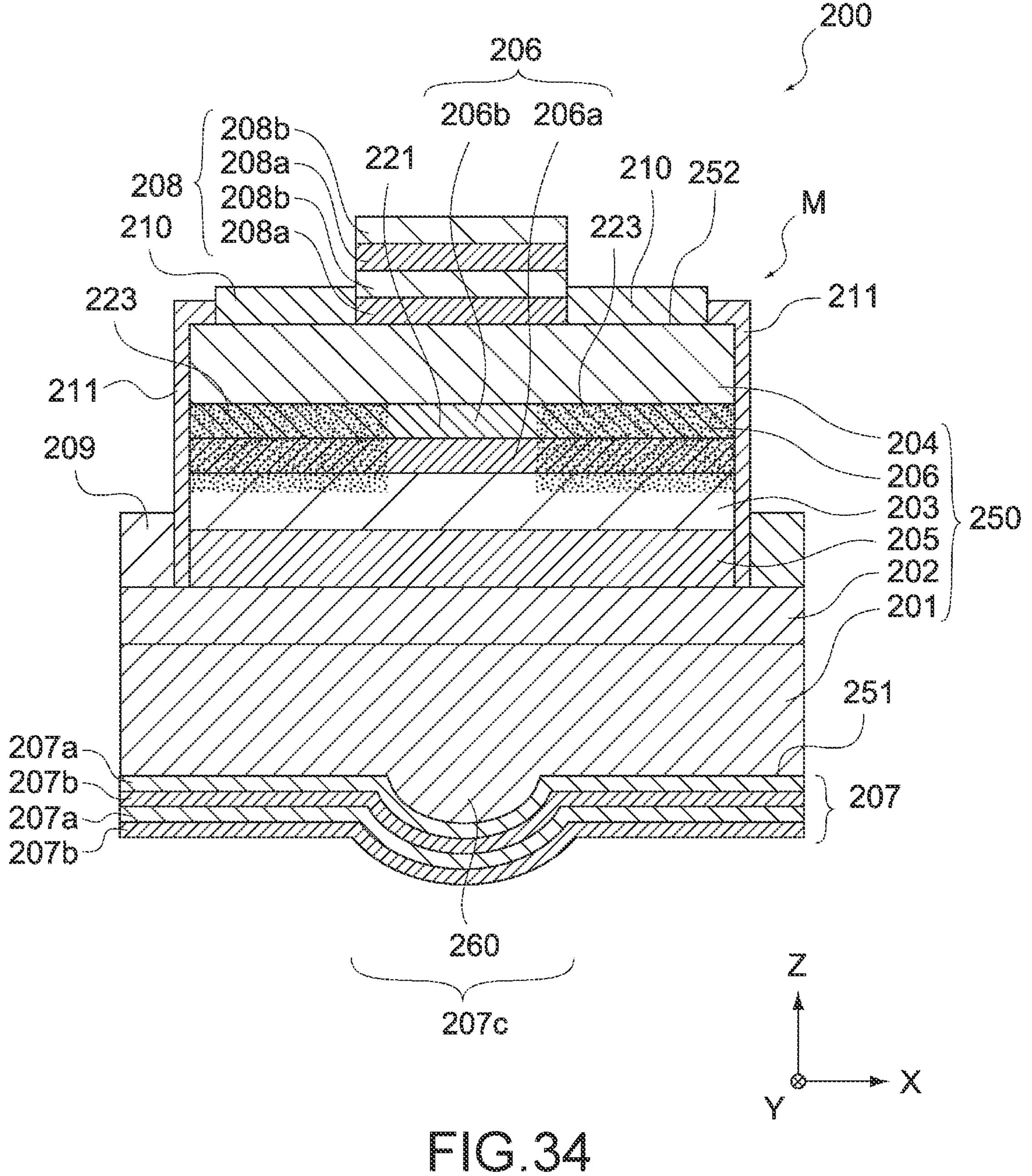
FIG. 34 is a cross-sectional view of a laser device having another configuration according to the second embodiment of the present technology.

FIG. 34 is a cross-sectional view of the laser device 200 having an insulation region 223 formed by ion implantation. In this configuration, the tunnel junction layer 206 is disposed entirely between the second semiconductor layer 203 and the third semiconductor layer 204, and the insulation region 223 (dotted region) is provided in the outer peripheral region of the tunnel junction layer 206.

As shown in FIG. 34, the current confinement structure has the current injection region 221 and the insulation region 223. The current injection region 221 is formed by the tunnel junction layer 206 into which ions are not implanted. Meanwhile, the insulation region 223 is a region that surrounds the current injection region 221 in the layer surface direction (X-Y direction) and is insulated by implanting ions into the tunnel junction layer 206. The ions to be implanted into the ion implantation region can be B (boron) ions. Further, ions capable of insulating the semiconductor material, such as O (oxygen) ions and H (hydrogen) ions, may be used instead of the B ions.

Also in this configuration, since a current flowing through the laser device 200 cannot pass through the insulation region 223, the current concentrates in the current injection region 221. That is, a current confinement structure is formed by the current injection region 221 and the insulation region 223.

[Another Configuration of Laser Device]

Although the respective layers are stacked on the substrate 201 to prepare the stacked body 250 in the above description, the stacked body 250 can be formed by stacking the respective layers on another support substrate, removing the support substrate, and bonding the layers to the substrate 201. Further, the laser device 200 can include a wavelength conversion layer (see FIG. 27) that changes the wavelength of emitted light on the side of the second light-reflecting layer 208 opposite to the stacked body 250, similarly to the first embodiment.

Further, although the first semiconductor layer 202 and the third semiconductor layer 204 have been formed of an n-type semiconductor material and the second semiconductor layer 203 has been formed of a p-type semiconductor material, the first semiconductor layer 202 and the third semiconductor layer 204 may be formed of a p-type semiconductor material and the second semiconductor layer 203 may be formed of an n-type semiconductor material. In this case, the first layer 206$a$ of the tunnel junction layer 206 can be an n-type layer with a high impurity concentration, and the second layer 206$b$ can be a p-type layer with a high impurity concentration. Further, the laser device 200 may have another configuration capable of realizing the operation of the laser device 200 described above, instead of the above-mentioned configurations.

[Regarding Laser Device Array]

The laser devices 200 can be arrayed similarly to the first embodiment. Since each of the laser devices 200 is a favorable line light source emitting the laser light E without uneven luminance, the laser device array including the laser devices 200 can have a high output exceeding 1 W, for example, by arraying the laser devices 200. The laser device array including the laser devices 200 may include a wavelength conversion layer (see FIG. 28).

Third Embodiment

A laser device according to a third embodiment of the present technology will be described. The laser device according to this embodiment is different from the laser device according to the first embodiment mainly in the current confinement structure. The laser device according to this embodiment has a structure similar to that of a VCSEL device, but the laser device according to this embodiment is different from the VCSEL device in that resonance occurs not only in the Z direction but also in another direction (Y direction).

[Structure of Laser Device]

Figure 35:
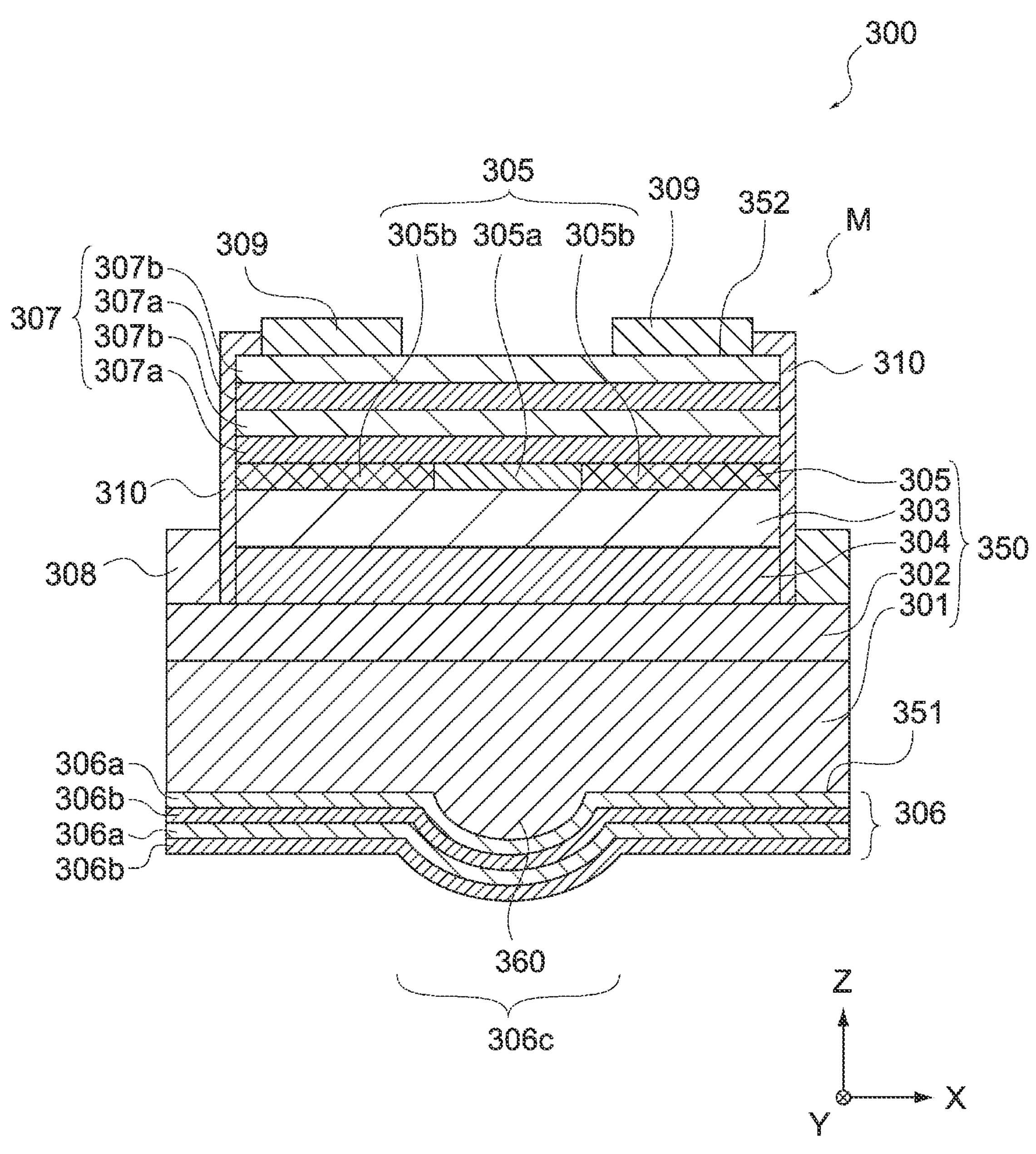
FIG. 35 is a cross-sectional view of a laser device according to a third embodiment of the present technology.
Figure 36:
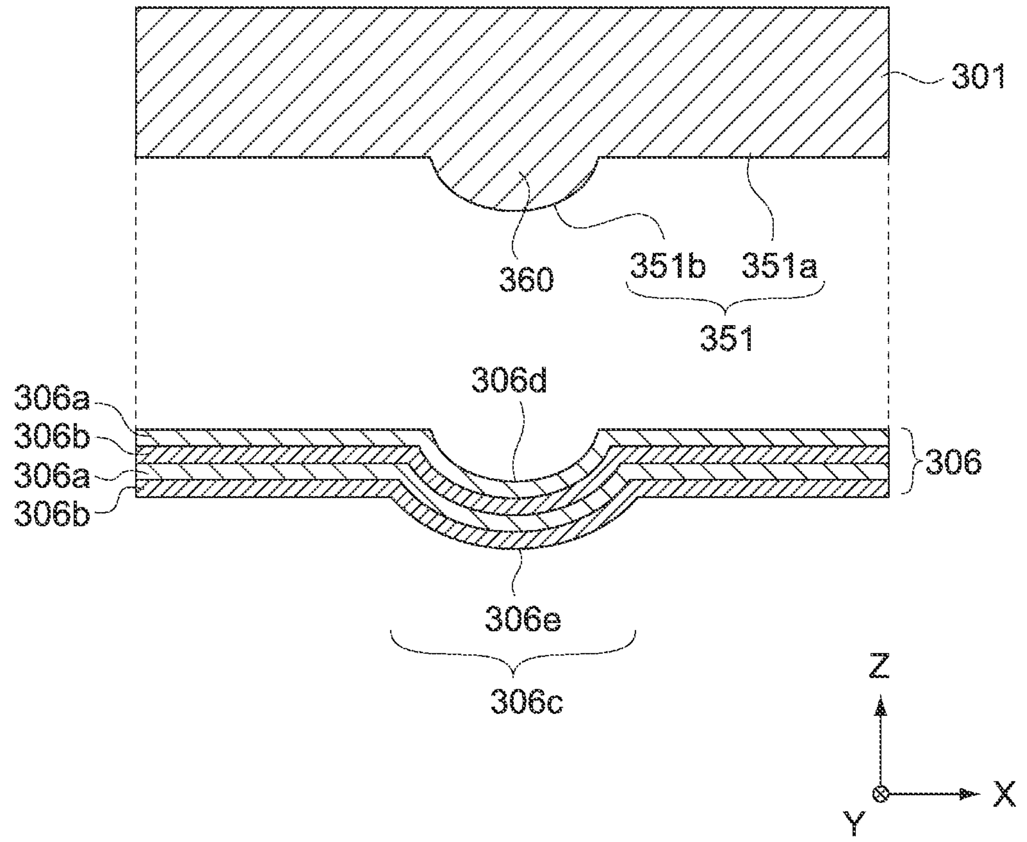
FIG. 36 is an exploded cross-sectional view showing a partial configuration of the laser device.

FIG. 35 is a cross-sectional view of a laser device 300 according to this embodiment, and FIG. 36 is an exploded cross-sectional view of a partial configuration of the laser device 300. As shown in these figures, the laser device 300 includes a substrate 301, a first semiconductor layer 302, a second semiconductor layer 303, an active layer 304, an oxidized confinement layer 305, a first light-reflecting layer 306, a second light-reflecting layer 307, a first electrode 308, a second electrode 309, and an insulation film 310. Of these, the substrate 301, the first semiconductor layer 302, the second semiconductor layer 303, the active layer 304, and the oxidized confinement layer 305 are collectively referred to as a stacked body 350.

Each of these layers has a layer surface direction along the X-Y plane, and the first light-reflecting layer 306, the substrate 301, the first semiconductor layer 302, the active layer 304, the second semiconductor layer 303, the oxidized confinement layer 305, and the second light-reflecting layer 307 are stacked in this order. Therefore, the stacked body 350 is disposed between the first light-reflecting layer 306 and the second light-reflecting layer 307.

The substrate 301 supports each of the layers of the laser device 300. The substrate 301 can include, for example, a semi-insulating GaAs substrate. As shown in FIG. 36, a lens 360 is provided on the substrate 301. This lens 360 will be described below.

The first semiconductor layer 302 is a layer that is formed of a semiconductor having a first conductivity type and transports carriers to the active layer 304. The first conductivity type can be an n-type, and the first semiconductor layer 302 can be formed of, for example, n-GaAs. The second semiconductor layer 303 is a layer that is formed of a semiconductor having a second conductivity type and transports carriers to the active layer 304. The second conductivity type can be a p-type, and the second semiconductor layer 303 can be a layer formed of, for example, p-GaAs.

The active layer 304 is a layer that is disposed between the first semiconductor layer 302 and the second semiconductor layer 303 and emits light by carrier recombination. The active layer 304 has a multiple quantum well structure in which a quantum well layer and a barrier layer are alternately stacked to obtain a plurality of layers, the quantum well layer can be formed of, for example, GaAs, and the barrier layer can be formed of, for example, AlGaAs. Further, the active layer 304 only needs to be a layer that emits light by carrier recombination instead of the multiple quantum well structure.

The oxidized confinement layer 305 forms a current confinement structure. The oxidized confinement layer 305 has a non-oxidized region 305*a* in which a semiconductor material is not oxidized and an oxidized region 305*b* in which a semiconductor material is oxidized. The non-oxidized region 305*a* is formed of a material of the second conductivity type with a high impurity concentration, and can be, for example, $p^+$-AlAs. The oxidized region 305*b* is formed of a material obtained by oxidizing the constituent material of the non-oxidized region 305*a* and can be, for example, an AlAs oxide.

As shown in FIG. 35, of surface of the stacked body 350, the surface on the side of the first light-reflecting layer 306 is defined as a first surface 351 and the surface on the side of the second light-reflecting layer 307 is defined as a second surface 352. The lens 360 is provided on the first surface 351. As a result, as shown in FIG. 36, the first surface 351 has a main surface 351*a* and a lens surface 351*b*. The main surface 351*a* is a plane (X-Y plane) perpendicular to the optical axis direction (Z direction) of emitted light. The lens surface 351*b* is a surface of the lens 360 and is a surface protruding from the main surface 351*a*.

The first light-reflecting layer 306 reflects light of a specific wavelength (hereinafter, a wavelength λ) and causes light of a wavelength other than that to be transmitted therethrough. The wavelength λ is a specific wavelength within, for example, 850 to 1400 nm. As shown in FIG. 35,] the first light-reflecting layer 306 can be a DBR (Distributed Bragg Reflector) including a multilayer light-reflecting film in which a high-refractive index layer 306*a* and a low-refractive index layer 306*b* having an optical film thickness of λ/4 are alternately stacked to obtain a plurality of layers. For example, the first light-reflecting layer 306 can have a layered structure of $Ta_2O_5/SiO_2$, $SiO_2/SiN$, $SiO_2/Nb_2O_5$, or the like.

The first light-reflecting layer 306 includes a concave mirror 306*c*. The first light-reflecting layer 306 is stacked on a second surface 301*b* of the substrate 301 to have a certain thickness, the surface thereof on the side of the stacked body 350 forms a concave surface 306*d* in accordance with the shape of the lens 360 provided on the first surface 351, and the surface on the side opposite to the stacked body 350 forms a convex surface 306*e*. As a result, the concave mirror 306*c* is formed in the first light-reflecting layer 306.

The second light-reflecting layer 307 reflects light of the wavelength λ and causes light of a wavelength other than that to be transmitted therethrough. As shown in FIG. 35, the second light-reflecting layer 307 can be a DBR (Distributed Bragg Reflector) including a multilayer light-reflecting film in which a high-refractive index layer 307*a* and a low-refractive index layer 307*b* having an optical film thickness of λ/4 are alternately stacked to obtain a plurality of layers. The second light-reflecting layer 307 can be a semiconductor DBR formed of a semiconductor material.

As shown in FIG. 35, the outer periphery portions of the active layer 304, the second semiconductor layer 303, the oxidized confinement layer 305, and the second light-reflecting layer 307 are removed to form a mesa (plateau structure) M.

The first electrode 308 is provided around the mesa M on the first semiconductor layer 302 and functions as one electrode of the laser device 300. The first electrode 308 can include, for example, a single-layer metal film formed of Au, Ni, Ti, or the like, or a multiplayer metal film formed of Ti/Au, Ag/Pd, Ni/Au/Pt, or the like.

The second electrode 309 is provided on the second light-reflecting layer 307 and functions as the other electrode of the laser device 300. The second electrode 309 can include, for example, a single-layer metal film formed of Au, Ni, Ti, or the like, or a multiplayer metal film formed of Ti/Au, Ag/Pd, Ni/Au/Pt, or the like. The insulation film 310 is provided around the second electrode 309 on the side surface of the mesa M and the upper surface of the mesa M to insulate the outer periphery of the mesa M. The insulation film 310 is formed of an arbitrary insulating material.

Figure 37:
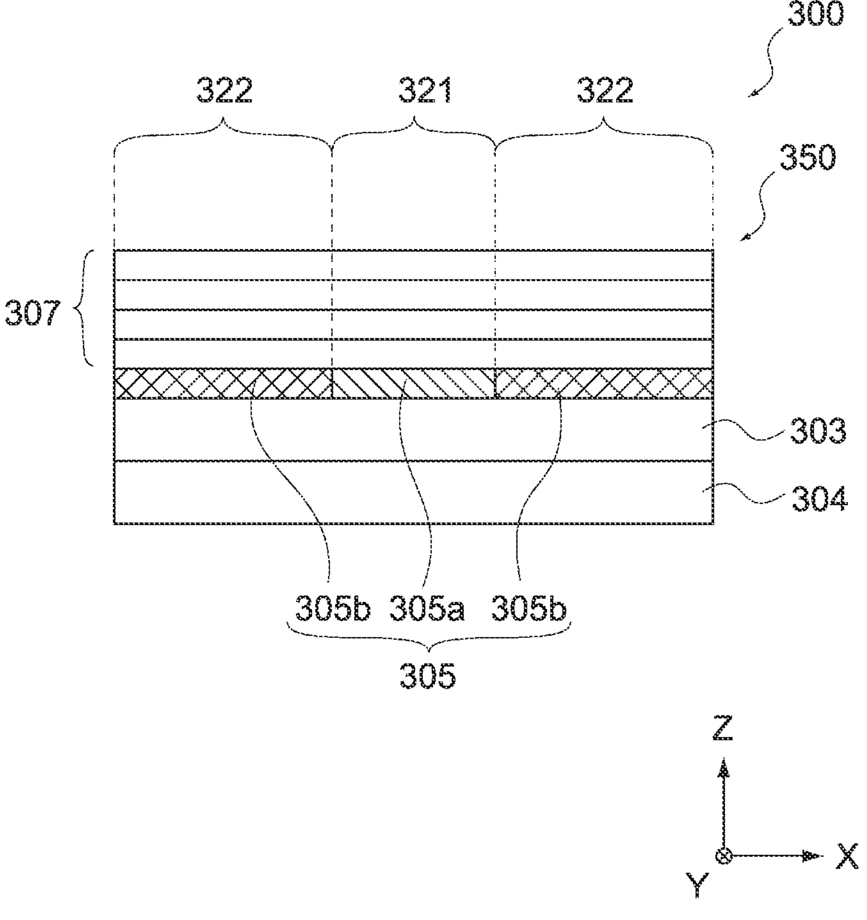
FIG. 37 is a schematic diagram showing a current confinement structure of the laser device.

In the laser device 300, a current confinement structure is formed in the stacked body 350 by the oxidized confinement layer 305. FIG. 37 is a schematic diagram showing a current confinement structure. As shown in the figure, the current confinement structure has a current injection region 321 and an insulation region 322. The current injection region 321 is a region having conductivity by the non-oxidized region 305*a*. The insulation region 322 is a region that surrounds the current injection region 221 in the layer surface direction (X-Y direction) and has no conductivity by the oxidized region 305*b* insulated by oxidation. Since a current flowing through the laser device 300 cannot pass through the insulation region 322, the current concentrates in the current injection region 321. That is, in the laser device 300, a current confinement structure is formed by the oxidized confinement layer 305.

[Regarding Shapes of Current Injection Region and Lens]

The shape of the current injection region 321 in the laser device 300 is the same as that of the current injection region 321 according to the first embodiment. That is, the current injection region 321 has an elongated plane shape with the first direction A1 as the longitudinal direction and the second direction A2 as the lateral direction (see FIG. 3 and FIG. 4). The first direction A1 and the second direction A2 are orthogonal to the optical axis direction (Z direction) and are directions orthogonal to each other.

Further, also the shape of the lens 360 in the laser device 300 is the same as that of the lens 160 according to the first embodiment. That is, the lens 360 has an elongated lens shape with the first direction A1 as the longitudinal direction and the second direction A2 as the lateral direction. Also the length, width, and height of the lens 360, the radius of curvature of the apex of the lens, and the surface accuracy (RMS) are the same as those in the lens 160.

Note that although the lens 360 may be formed by part of the substrate 301 as shown in FIG. 36, the lens 360 may include a member that is different from the substrate 301 and bonded to the substrate 301 (see FIG. 12).

[Operation of Laser Device]

The laser device 300 operates similarly to the laser device 100 according to the first embodiment. That is, when a voltage is applied between the first electrode 308 and the second electrode 309, a current flows between the first electrode 308 and the second electrode 309. The current is confined by the current confinement structure and injected to the current injection region 321. The spontaneous emission light generated by this injected current is reflected by the first light-reflecting layer 306 and the second light-reflecting layer 307 to cause laser oscillation. The laser light generated thereby is transmitted through the second light-reflecting layer 307 and is emitted from the laser device 300 with the Z direction as the optical axis direction. The laser device 300 is capable of emitting the laser light E having a large beam diameter and a narrow radiation angle by the shapes of the current injection region 321 and the lens 360, and operates as a line light source that emits a linear beam.

[Effects of Laser Device]

Also the laser device 300 includes the lens 360 in which the height $H_s$ from the main surface 351*a* and the radius of curvature $R_s$ (see FIG. 9) of the apex of the lens in the second direction A2 are uniform. For this reason, by forming the current injection region 321 on the lens 360, it is possible to form a mode having resonance in the optical axis direction (Z direction) and resonance in the longitudinal direction (Y direction) of the lens 360, and realize the laser device 300 that emits light having high linearity. Further, in the laser device 300, the transverse mode can be unified because the radius of curvature $R_s$ of the apex of the lens is uniform, and the longitudinal mode can be unified because the height $H_s$ is uniform, in some cases. As a result, the laser light E without uneven luminance can be emitted, and therefore, the laser device 300 is capable of realizing a favorable line light source. Further, since the height is more uniform in the lens 360 and a stress is dispersed, it is possible to improve the durability.

[Method of Producing Laser Device]

In the method of producing the laser device 300, after stacking the respective layers up to the second light-reflecting layer 307 on the substrate 301 by a metal organic-chemical vapor deposition method or the like, the mesa M is formed by photolithography and etching. Subsequently, the oxidized region 305*b* is formed by oxidizing the material of the oxidized confinement layer 305 from the side of the outer periphery by a method such as heating the stacked body 350 under a water vapor atmosphere. At this time, the shape of the non-oxidized region 305*a* when viewed from the Z direction can be controlled by the shape of the mesa M when viewed from the Z direction.

Further, the lens 360 is provided on the substrate 301 by a method similar to that in the first embodiment, and the first light-reflecting layer 306, the second light-reflecting layer 307, and the like are stacked, thereby making it possible to produce the laser device 300. Further, the laser device 300 can be produced by another production method.

[Another Configuration of Laser Device]

Although the respective layers are stacked on the substrate 301 to prepare the stacked body 350 in the above description, the stacked body 350 can be formed by stacking the respective layers on another support substrate, removing the support substrate, and bonding the layers to the substrate 301. Further, the laser device 300 can include a wavelength conversion layer (see FIG. 27) that changes the wavelength of emitted light on the side of the second light-reflecting layer 307 opposite to the stacked body 350, similarly to the first embodiment.

Further, although the first semiconductor layer 302 has been formed of an n-type semiconductor material and the second semiconductor layer 303 has been formed of a p-type semiconductor material, the first semiconductor layer 302 may be formed of a p-type semiconductor material and the second semiconductor layer 303 may be formed of an n-type semiconductor material. In this case, the non-oxidized region 305*a* of the oxidized confinement layer 305 can be formed of an n-type material with a high impurity concentration. Further, the laser device 300 may have another configuration capable of realizing the operation of the laser device 300 described above, instead of the above-mentioned configurations.

[Regarding Laser Device Array]

The laser devices 300 can be arrayed similarly to the first embodiment. Since each of the laser devices 300 is a favorable line light source emitting the laser light E without uneven luminance, the laser device array including the laser devices 300 can have a high output exceeding 1 W, for example, by arraying the laser devices 300. The laser device array including the laser devices 300 may include a wavelength conversion layer (see FIG. 28).

(Regarding Present Disclosure)

The effects described in the present disclosure are merely examples and are not limited, and additional effects may be exerted. The description of the plurality of effects described above does not necessarily mean that these effects are exhibited simultaneously. It means that at least one of the effects described above can be achieved in accordance with the conditions or the like, and there is a possibility that an effect that is not described in the present disclosure is exerted. Further, at least two feature portions of the feature portions described in the present disclosure may be arbitrarily combined with each other.

It should be noted that the present technology may also take the following configurations.

(1) A laser device, including:

a first light-reflecting layer that reflects light of a specific wavelength;

a second light-reflecting layer that reflects light of the wavelength; and a stacked body that includes a first semiconductor layer, a second semiconductor layer, and an active layer, is disposed between the first light-reflecting layer and the second light-reflecting layer, and has a first surface on a side of the first light-reflecting layer and a second surface on a side of the second light-reflecting layer, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination, a lens being provided on the first surface, the lens having a lens shape protruding toward a side of the first light-reflecting layer with a first direction as a longitudinal direction and a second direction as a lateral direction, the first direction being parallel to a plane perpendicular to an optical axis direction of emitted light, the second direction being parallel to the plane and orthogonal to the first direction, a central portion of the lens in the first direction having a first width that is the shortest width along the second direction, a non-central portion of the lens in the first direction having a second width that is the largest width along the second direction, the lens having a shape in which a height thereof from the plane is uniform or the central portion is higher than an end portion, a radius of curvature of an apex of the lens in the second direction being uniform, the first light-reflecting layer being stacked on the first surface to form a concave mirror having a concave surface shape on the lens.

(2) The laser device according to (1) above, in which the stacked body has a current confinement structure that confines a current and forms a current injection region where a current concentrates, and the current injection region has a shape in which a plane figure thereof when viewed from the optical axis direction overlaps the lens when viewed from the optical axis direction with the first direction as a longitudinal direction and the second direction as a lateral direction.

(3) The laser device according to (1) or (2) above, in which a length of the lens along the first direction is greater than the second width.

(4) The laser device according to any one of (1) to (3) above, in which a length of the lens along the first direction is 40 μm or more.

(5) The laser device according to any one of (1) to (4) above, in which the second width of the lens is 10 μm or more.

(6) The laser device according to any one of (1) to (5) above, in which a resonator length of the laser device is a distance between the concave mirror and the second light-reflecting layer, and the radius of curvature is equal to or greater than the resonator length.

(7) The laser device according to any one of (1) to (6) above, in which a surface accuracy of a surface of the lens is 1.0 nm or less in RMS (Root Mean Square).

(8) The laser device according to any one of (1) to (7) above, in which the first semiconductor layer and the second semiconductor layer are formed of GaN.

(9) The laser device according to any one of (1) to (7) above, in which the first semiconductor layer and the second semiconductor layer are formed of GaAs.

(10) The laser device according to any one of (1) to (7) above, in which the first semiconductor layer and the second semiconductor layer are formed of InP.

(11) The laser device according to any one of (1) to (10) above, further including a wavelength conversion layer that is provided on a side of the second light-reflecting layer opposite to the stacked body and is formed of a wavelength conversion material.

(12) The laser device according to any one of (1) to (11) above, in which the first light-reflecting layer and the second reflecting layer are each a DBR (Distributed Bragg Reflector) including a multilayer light-reflecting film.

(13) A laser device array in which a plurality of laser devices that can be individually driven are arranged, the laser device including a first light-reflecting layer that reflects light of a specific wavelength, a second light-reflecting layer that reflects light of the wavelength, and a stacked body that includes a first semiconductor layer, a second semiconductor layer, and an active layer, is disposed between the first light-reflecting layer and the second light-reflecting layer, and has a first surface on a side of the first light-reflecting layer and a second surface on a side of the second light-reflecting layer, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination, a lens being provided on the first surface, the lens having a lens shape protruding toward a side of the first light-reflecting layer with a first direction as a longitudinal direction and a second direction as a lateral direction, the first direction being parallel to a plane perpendicular to an optical axis direction of emitted light, the second direction being parallel to the plane and orthogonal to the first direction, a central portion of the lens in the first direction having a first width that is the shortest width along the second direction, a non-central portion of the lens in the first direction having a second width that is the largest width along the second direction, the lens having a shape in which a height thereof from the plane is uniform or the central portion is higher than an end portion, a radius of curvature of an apex of the lens in the second direction being uniform, the first light-reflecting layer being stacked on the first surface to form a concave mirror having a concave surface shape on the lens.

(14) A method of producing a laser device, including:

preparing a stacked body that includes a first semiconductor layer, a second semiconductor layer, and an active layer, and has a first surface and a second surface, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination;

forming, on the first surface, a structure that is formed of a fluid material and has a certain thickness with a first direction as a longitudinal direction and a second direction as a lateral direction, the first direction being parallel to a plane perpendicular to an optical axis direction of emitted light, the second direction being parallel to the plane and orthogonal to the first direction, a central portion of the structure in the first direction having a first width that is the shortest width along the second direction, a non-central portion of the structure in the first direction having a second width that is the largest width along the second direction;

deforming the structure by heating the structure to flow the fluid material and using a shape of the structure to form, on the first surface, a lens having a shape in which a height thereof from the plane is uniform or a central portion thereof is higher than an end portion, a radius of curvature of an apex of the lens in the second direction being uniform;

stacking, on the first surface, a first light-reflecting layer that reflects light of a specific wavelength to form a concave mirror having a concave surface shape on the lens; and forming a second light-reflecting layer that reflects light of the wavelength on a side of the second surface of the stacked body.

(15) The method of producing a laser device according to (14) above, in which the step of forming a lens includes deforming the structure into a lens shape protruding toward a side of the first light-reflecting layer with the first direction as a longitudinal direction and the second direction as a lateral direction, the central portion having the first width, the non-central portion having the second width, the structure having a shape in which a height thereof from the plane is uniform or the central portion is higher than an end portion, a radius of curvature of an apex of the structure in the second direction being uniform.

(16) The method of producing a laser device according to (15) above, in which the step of forming a lens includes etching the stacked body using the structure deformed into the shape as an etching mask to form the lens on the first surface.

(17) The method of producing a laser device according to (15) above, in which the step of forming a lens includes using, as the lens, the structure deformed into the shape.

(18) The method of producing a laser device according to any one of (14) to (17) above, in which a length of the structure along the first direction is greater than the second width.

(19) The method of producing a laser device according to any one of (14) to (18) above, in which a length of the structure along the first direction is 40 μm or more.

(20) The method of producing a laser device according to any one of (14) to (19) above, in which the etching is dry etching or wet etching.

REFERENCE SIGNS LIST

100, 200, 300 laser device
201, 301 substrate
101, 202, 302 first semiconductor layer
102, 203, 303 second semiconductor layer
204 third semiconductor layer
103, 205, 304 active layer
206 tunnel junction layer
305 oxidized confinement layer
104, 207, 306 first light-reflecting layer
104*c*, 207*c*, 306*c* concave mirror
105, 208, 307 second light-reflecting layer
106, 209, 308 first electrode
107, 210, 309 second electrode
121, 221, 321 current injection region
122, 222, 322 insulation region
150, 250, 350 stacked body
160, 260, 360 lens
170, 270, 370 structure
175, 275, 375 structure
181 wavelength conversion layer

The invention claimed is:

1. A laser device, comprising:

a first light-reflecting layer that reflects light of a specific wavelength;

a second light-reflecting layer that reflects light of the wavelength; and a stacked body that includes a first semiconductor layer, a second semiconductor layer, and an active layer, is disposed between the first light-reflecting layer and the second light-reflecting layer, and has a first surface on a side of the first light-reflecting layer and a second surface on a side of the second light-reflecting layer, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination, a lens being provided on the first surface, the lens having a lens shape protruding toward a side of the first light-reflecting layer with a first direction as a longitudinal direction and a second direction as a lateral direction, the first direction being parallel to a plane perpendicular to an optical axis direction of emitted light, the second direction being parallel to the plane and orthogonal to the first direction, a central portion of the lens in the first direction having a first width that is the shortest width along the second direction, a non-central portion of the lens in the first direction having a second width that is the largest width along the second direction, the lens having a shape in which a height thereof from the plane is uniform or the central portion is higher than an end portion, a radius of curvature of an apex of the lens in the second direction being uniform, the first light-reflecting layer being stacked on the first surface to form a concave mirror having a concave surface shape on the lens.

2. The laser device according to claim 1, wherein the stacked body has a current confinement structure that confines a current and forms a current injection region where a current concentrates, and the current injection region has a shape in which a plane figure thereof when viewed from the optical axis direction overlaps the lens when viewed from the optical axis direction with the first direction as a longitudinal direction and the second direction as a lateral direction.

3. The laser device according to claim 1, wherein a length of the lens along the first direction is greater than the second width.

4. The laser device according to claim 1, wherein a length of the lens along the first direction is 40 μm or more.

5. The laser device according to claim 1, wherein the second width of the lens is 10 μm or more.

6. The laser device according to claim 1, wherein a resonator length of the laser device is a distance between the concave mirror and the second light-reflecting layer, and the radius of curvature is equal to or greater than the resonator length.

7. The laser device according to claim 1, wherein a surface accuracy of a surface of the lens is 1.0 nm or less in RMS (Root Mean Square).

8. The laser device according to claim 1, wherein the first semiconductor layer and the second semiconductor layer are formed of GaN.

9. The laser device according to claim 1, wherein the first semiconductor layer and the second semiconductor layer are formed of GaAs.

10. The laser device according to claim 1, wherein the first semiconductor layer and the second semiconductor layer are formed of InP.

11. The laser device according to claim 1, further comprising a wavelength conversion layer that is provided on a side of the second light-reflecting layer opposite to the stacked body and is formed of a wavelength conversion material.

12. The laser device according to claim 1, wherein the first light-reflecting layer and the second reflecting layer are each a DBR (Distributed Bragg Reflector) including a multilayer light-reflecting film.

13. A laser device array in which a plurality of laser devices that can be individually driven are arranged, the laser device including a first light-reflecting layer that reflects light of a specific wavelength, a second light-reflecting layer that reflects light of the wavelength, and a stacked body that includes a first semiconductor layer, a second semiconductor layer, and an active layer, is disposed between the first light-reflecting layer and the second light-reflecting layer, and has a first surface on a side of the first light-reflecting layer and a second surface on a side of the second light-reflecting layer, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination, a lens being provided on the first surface, the lens having a lens shape protruding toward a side of the first light-reflecting layer with a first direction as a longitudinal direction and a second direction as a lateral direction, the first direction being parallel to a plane perpendicular to an optical axis direction of emitted light, the second direction being parallel to the plane and orthogonal to the first direction, a central portion of the lens in the first direction having a first width that is the shortest width along the second direction, a non-central portion of the lens in the first direction having a second width that is the largest width along the second direction, the lens having a shape in which a height thereof from the plane is uniform or the central portion is higher than an end portion, a radius of curvature of an apex of the lens in the second direction being uniform, the first light-reflecting layer being stacked on the first surface to form a concave mirror having a concave surface shape on the lens.

14. A method of producing a laser device, comprising:

preparing a stacked body that includes a first semiconductor layer, a second semiconductor layer, and an active layer, and has a first surface and a second surface, the first semiconductor layer being formed of a semiconductor material having a first conductivity type, the second semiconductor layer being formed of a semiconductor material having a second conductivity type, the active layer being disposed between the first semiconductor layer and the second semiconductor layer and emitting light by carrier recombination;

forming, on the first surface, a structure that is formed of a fluid material and has a certain thickness with a first direction as a longitudinal direction and a second direction as a lateral direction, the first direction being parallel to a plane perpendicular to an optical axis direction of emitted light, the second direction being parallel to the plane and orthogonal to the first direction, a central portion of the structure in the first direction having a first width that is the shortest width along the second direction, a non-central portion of the structure in the first direction having a second width that is the largest width along the second direction;

deforming the structure by heating the structure to flow the fluid material and using a shape of the structure to form, on the first surface, a lens having a shape in which a height thereof from the plane is uniform or a central portion thereof is higher than an end portion, a radius of curvature of an apex of the lens in the second direction being uniform;

stacking, on the first surface, a first light-reflecting layer that reflects light of a specific wavelength to form a concave mirror having a concave surface shape on the lens; and forming a second light-reflecting layer that reflects light of the wavelength on a side of the second surface of the stacked body.

15. The method of producing a laser device according to claim 14, wherein the step of forming a lens includes deforming the structure into a lens shape protruding toward a side of the first light-reflecting layer with the first direction as a longitudinal direction and the second direction as a lateral direction, the central portion having the first width, the non-central portion having the second width, the structure having a shape in which a height thereof from the plane is uniform or the central portion is higher than an end portion, a radius of curvature of an apex of the structure in the second direction being uniform.

16. The method of producing a laser device according to claim 15, wherein the step of forming a lens includes etching the stacked body using the structure deformed into the shape as an etching mask to form the lens on the first surface.

17. The method of producing a laser device according to claim 15, wherein the step of forming a lens includes using, as the lens, the structure deformed into the shape.

18. The laser device according to claim 14, wherein a length of the structure along the first direction is greater than the second width.

19. The laser device according to claim 14, wherein a length of the structure along the first direction is 40 μm or more.

20. The laser device according to claim 16, wherein the etching is dry etching or wet etching.

* * * * *